United States Patent
Lin et al.

(10) Patent No.: US 9,679,863 B2
(45) Date of Patent: Jun. 13, 2017

(54) SEMICONDUCTOR DEVICE AND METHOD OF FORMING INTERCONNECT SUBSTRATE FOR FO-WLCSP

(75) Inventors: Yaojian Lin, Singapore (SG); Jianmin Fang, Shanghai (CN); Xia Feng, Singapore (SG); Kang Chen, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 612 days.

(21) Appl. No.: 13/243,214

(22) Filed: Sep. 23, 2011

(65) Prior Publication Data
US 2013/0075936 A1   Mar. 28, 2013

(51) Int. Cl.
*H01L 23/48* (2006.01)
*H01L 23/00* (2006.01)
(Continued)

(52) U.S. Cl.
CPC ............ *H01L 24/24* (2013.01); *H01L 21/561* (2013.01); *H01L 21/568* (2013.01); *H01L 21/6836* (2013.01); *H01L 23/49816* (2013.01); *H01L 23/49827* (2013.01); *H01L 23/5389* (2013.01); *H01L 24/11* (2013.01); *H01L 24/19* (2013.01); *H01L 24/20* (2013.01); *H01L 24/82* (2013.01); *H01L 24/94* (2013.01); *H01L 24/96* (2013.01); *H01L 24/97* (2013.01); *H01L 25/105* (2013.01); *H01L 25/50* (2013.01); *H01L 21/6835* (2013.01); *H01L 23/3128* (2013.01); *H01L 24/13* (2013.01); *H01L 24/81* (2013.01); *H01L 2221/68304* (2013.01); *H01L 2221/68331* (2013.01); *H01L 2221/68359* (2013.01); *H01L 2221/68377* (2013.01);
(Continued)

(58) Field of Classification Search
CPC ..................... H01L 25/0657; H01L 2924/0107
USPC .......... 257/778, E23.021, E23.079, E25.013, 257/E21.508, E21.705, 784, 786, 737, 257/734, 738, 760, 758
See application file for complete search history.

(56) References Cited

U.S. PATENT DOCUMENTS 5,657,537 A * 8/1997 Saia .................... H01L 23/5389
                                                    257/686
5,841,193 A * 11/1998 Eichelberger ................. 257/723
(Continued)

*Primary Examiner* — Eugene Lee
(74) *Attorney, Agent, or Firm* — Robert D. Atkins; Patent Law Group: Atkins and Associates, P.C.

(57) ABSTRACT

A semiconductor device has a first encapsulant deposited over a first carrier. A plurality of conductive vias is formed through the first encapsulant to provide an interconnect substrate. A first semiconductor die is mounted over a second carrier. The interconnect substrate is mounted over the second carrier adjacent to the first semiconductor die. A second semiconductor die is mounted over the second carrier adjacent to the interconnect substrate. A second encapsulant is deposited over the first and second semiconductor die, interconnect substrate, and second carrier. A first interconnect structure is formed over a first surface of the second encapsulant and electrically connected to the conductive vias. A second interconnect structure is formed over a second surface of the second encapsulant and electrically connected to the conductive vias to make the Fo-WLCSP stackable. Additional semiconductor die can be mounted over the first and second semiconductor die in a PoP arrangement.

5 Claims, 28 Drawing Sheets

(51) Int. Cl.
*H01L 21/56* (2006.01)
*H01L 25/10* (2006.01)
*H01L 25/00* (2006.01)
*H01L 23/498* (2006.01)
*H01L 23/538* (2006.01)
*H01L 23/31* (2006.01)
*H01L 21/683* (2006.01)

(52) U.S. Cl.
CPC ............ *H01L 2224/1132* (2013.01); *H01L 2224/1134* (2013.01); *H01L 2224/1145* (2013.01); *H01L 2224/11334* (2013.01); *H01L 2224/11462* (2013.01); *H01L 2224/11464* (2013.01); *H01L 2224/11849* (2013.01); *H01L 2224/11901* (2013.01); *H01L 2224/12105* (2013.01); *H01L 2224/131* (2013.01); *H01L 2224/13111* (2013.01); *H01L 2224/13116* (2013.01); *H01L 2224/16145* (2013.01); *H01L 2224/16237* (2013.01); *H01L 2224/211* (2013.01); *H01L 2224/2101* (2013.01); *H01L 2224/215* (2013.01); *H01L 2224/245* (2013.01); *H01L 2224/24155* (2013.01); *H01L 2224/81815* (2013.01); *H01L 2224/82005* (2013.01); *H01L 2224/82101* (2013.01); *H01L 2224/82106* (2013.01); *H01L 2224/82986* (2013.01); *H01L 2224/94* (2013.01); *H01L 2224/96* (2013.01); *H01L 2224/97* (2013.01); *H01L 2225/1035* (2013.01); *H01L 2225/1058* (2013.01); *H01L 2924/01322* (2013.01); *H01L 2924/12041* (2013.01); *H01L 2924/12042* (2013.01); *H01L 2924/1306* (2013.01); *H01L 2924/13091* (2013.01); *H01L 2924/181* (2013.01)

(56) References Cited

U.S. PATENT DOCUMENTS

| | | | | |
|---|---|---|---|---|
| 6,221,694 B1* | 4/2001 | Bhatt | ........... | H01L 21/4803 257/E23.004 |
| 6,423,570 B1* | 7/2002 | Ma | ........... | H01L 21/561 257/612 |
| 6,586,822 B1* | 7/2003 | Vu et al. | ........... | 257/678 |
| 6,784,541 B2* | 8/2004 | Eguchi | ........... | H01L 21/56 257/675 |
| 6,992,396 B2* | 1/2006 | Arai | ........... | H01L 23/3128 257/777 |
| 7,045,391 B2* | 5/2006 | Lin | ........... | H01L 23/49816 257/E23.069 |
| 7,078,788 B2* | 7/2006 | Vu | ........... | H01L 21/56 174/521 |
| 7,242,099 B2* | 7/2007 | Lin et al. | ........... | 257/778 |
| 7,405,102 B2* | 7/2008 | Lee | ........... | H01L 23/3677 257/E21.705 |
| 7,545,047 B2 | 6/2009 | Bauer et al. | | |
| 7,619,901 B2* | 11/2009 | Eichelberger et al. | ........... | 361/763 |
| 7,750,455 B2* | 7/2010 | Pagaila et al. | ........... | 257/686 |
| 7,838,337 B2* | 11/2010 | Marimuthu et al. | ........... | 438/110 |
| 8,093,704 B2* | 1/2012 | Palmer | ........... | H01L 23/3157 257/686 |
| 8,110,920 B2* | 2/2012 | Dattaguru et al. | ........... | 257/724 |
| 8,395,259 B2* | 3/2013 | Eun | ........... | 257/737 |
| 2002/0137263 A1* | 9/2002 | Towle | ........... | H01L 21/56 438/127 |
| 2005/0017347 A1* | 1/2005 | Morimoto | ........... | H05K 1/186 257/703 |
| 2005/0062173 A1* | 3/2005 | Vu et al. | ........... | 257/787 |
| 2008/0224306 A1* | 9/2008 | Yang | ........... | 257/725 |
| 2009/0127686 A1* | 5/2009 | Yang et al. | ........... | 257/686 |
| 2010/0013101 A1* | 1/2010 | Hedler | ........... | H01L 21/561 257/773 |
| 2010/0133704 A1* | 6/2010 | Marimuthu | ........... | H01L 21/565 257/778 |
| 2010/0140772 A1* | 6/2010 | Lin et al. | ........... | 257/686 |
| 2010/0193928 A1* | 8/2010 | Zudock | ........... | H01L 21/568 257/686 |
| 2010/0237481 A1* | 9/2010 | Chi et al. | ........... | 257/685 |
| 2011/0156250 A1* | 6/2011 | Goh | ........... | H01L 25/16 257/738 |
| 2012/0228782 A1* | 9/2012 | Kawata | ........... | H01L 21/565 257/777 |
| 2013/0003319 A1* | 1/2013 | Malatkar | ........... | H01L 25/16 361/746 |

* cited by examiner

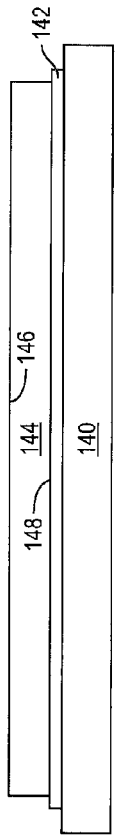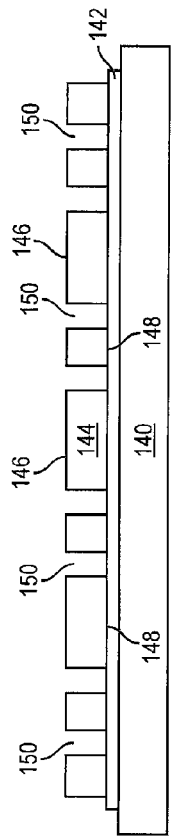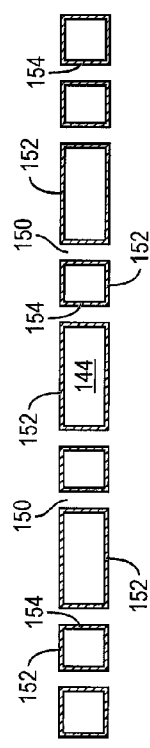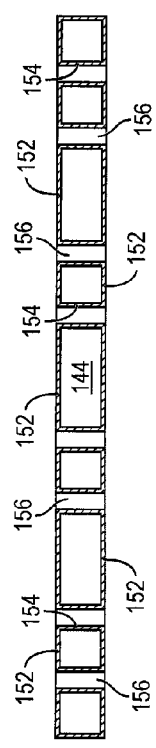

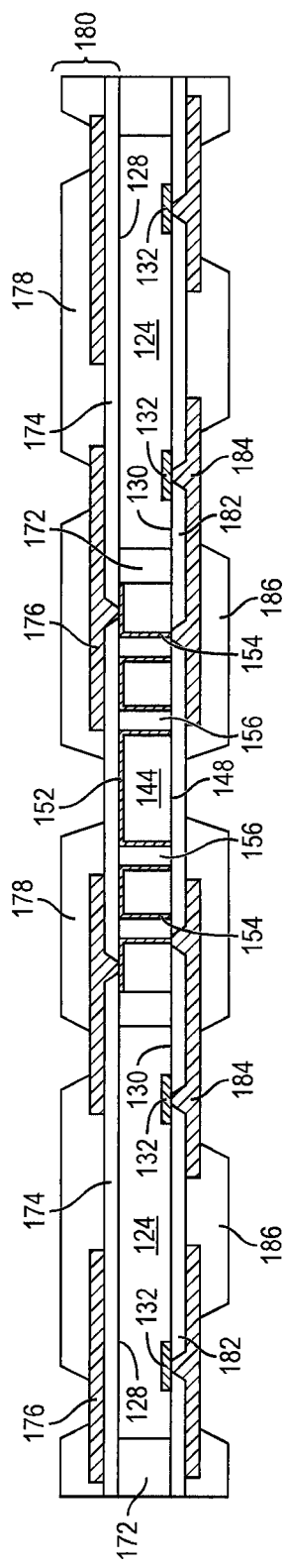
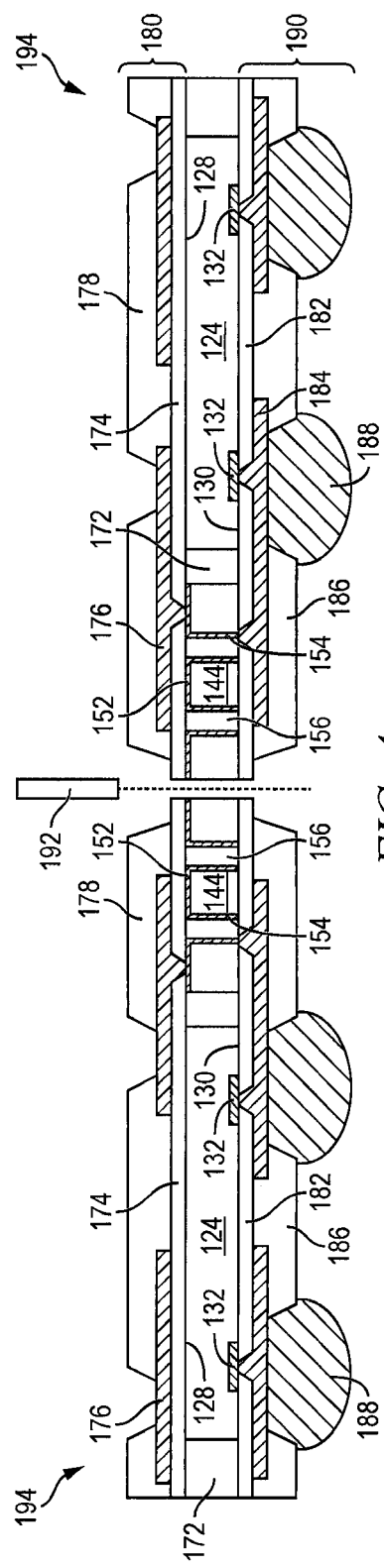
FIG. 4q
FIG. 4r

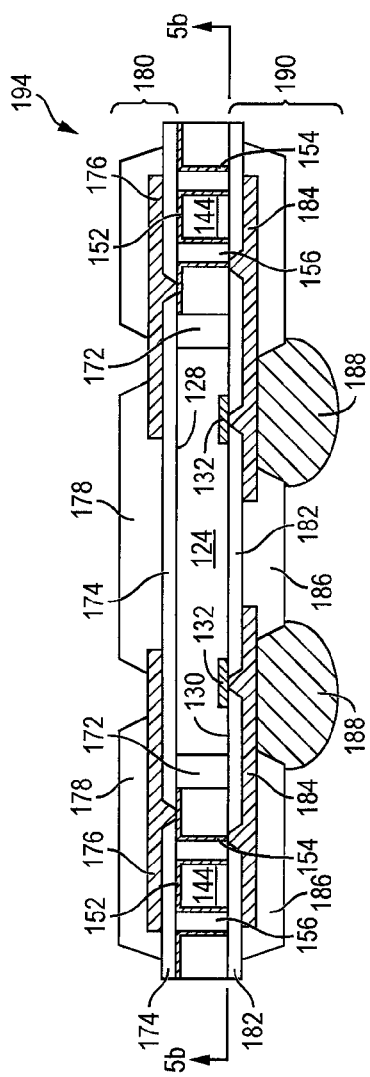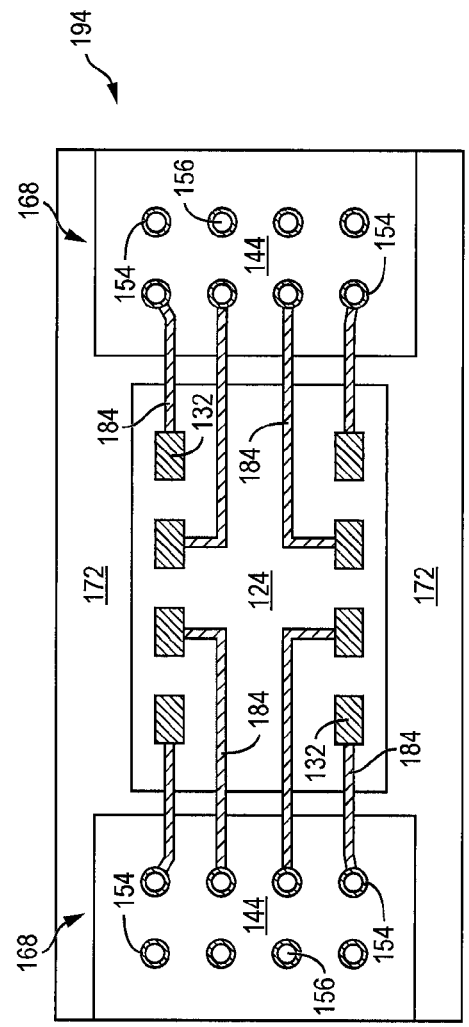
FIG. 5a
FIG. 5b

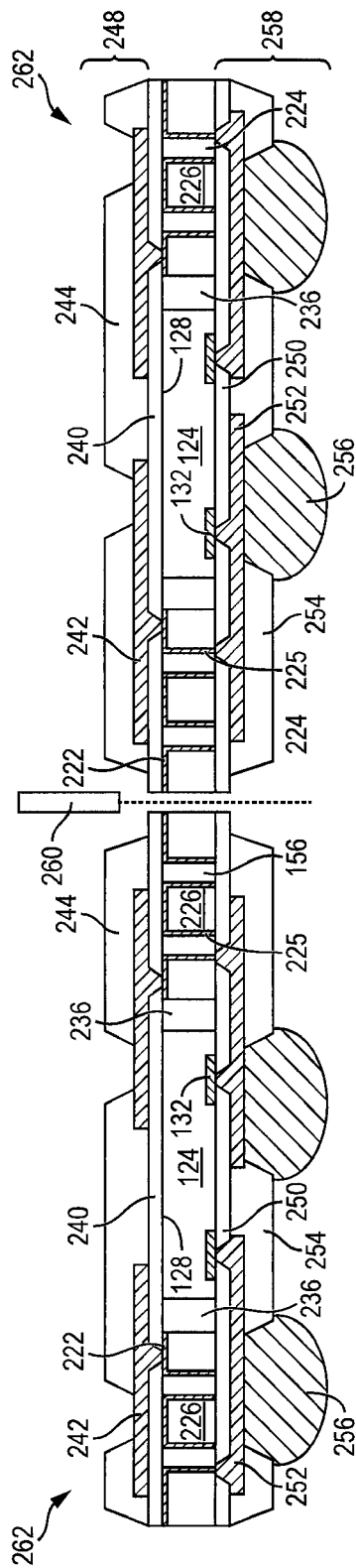
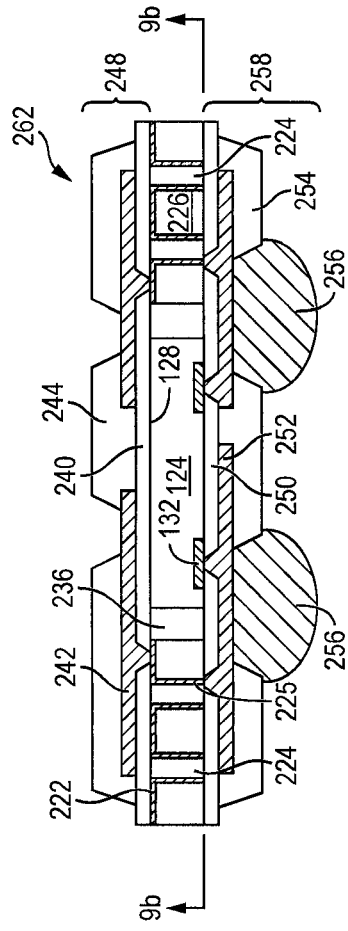
FIG. 8i
FIG. 9a

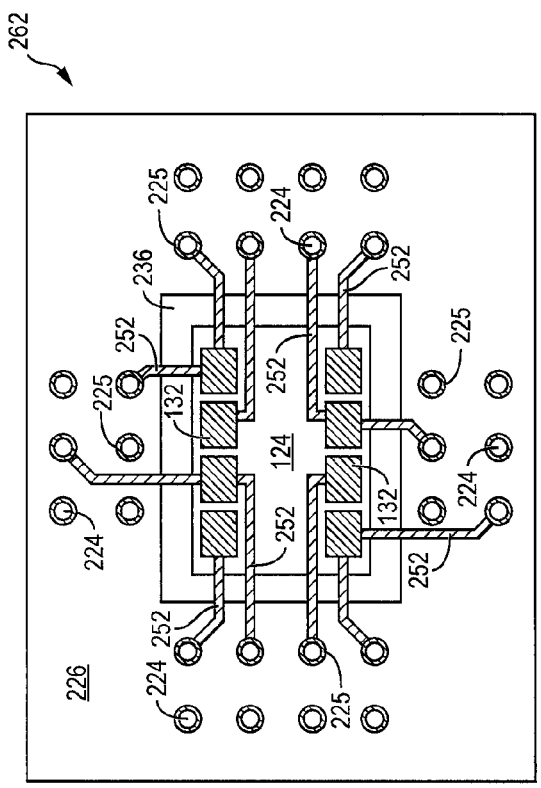 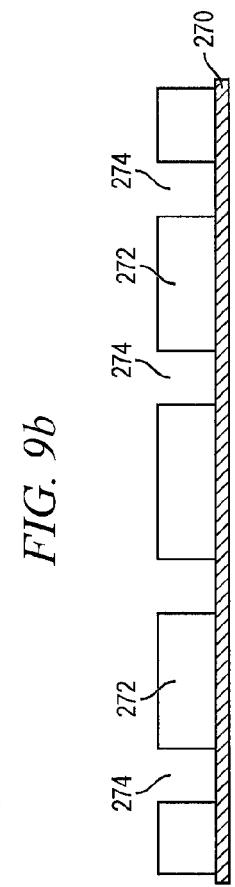 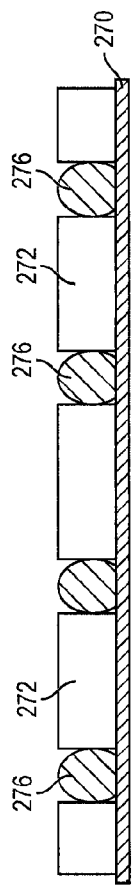
FIG. 9b
FIG. 10a
FIG. 10b

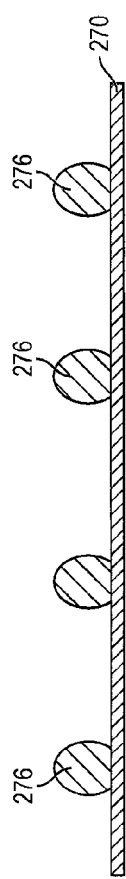
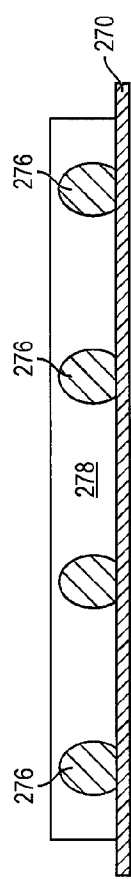
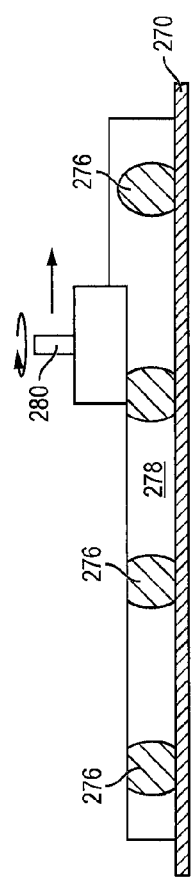
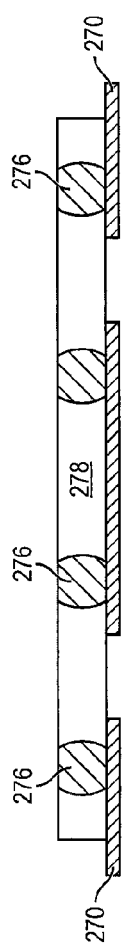

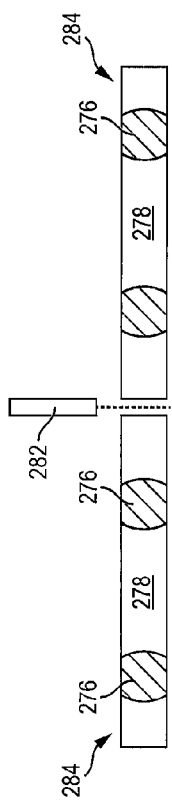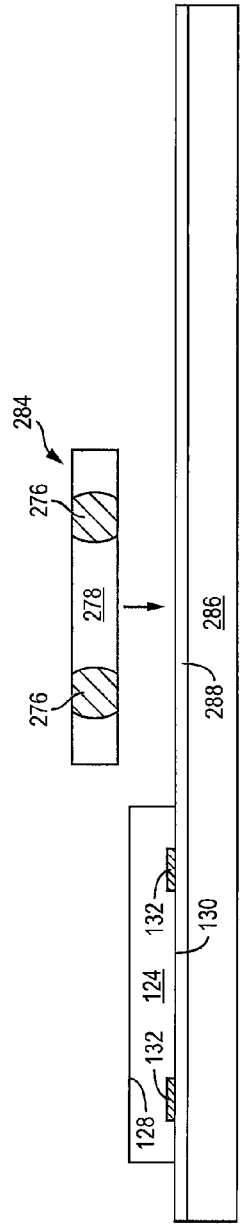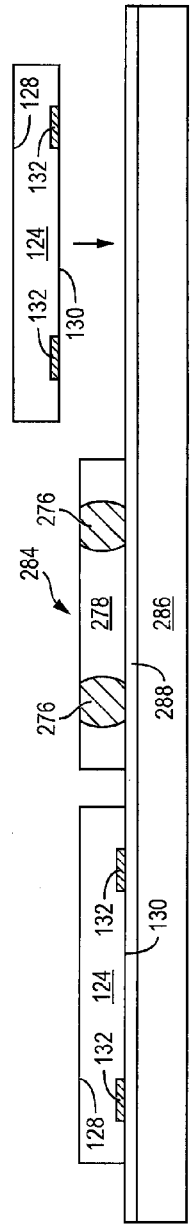

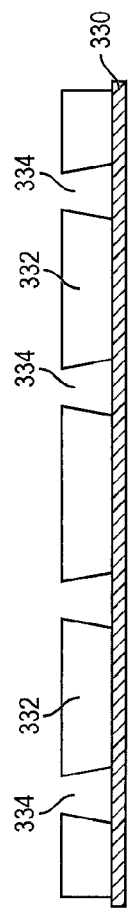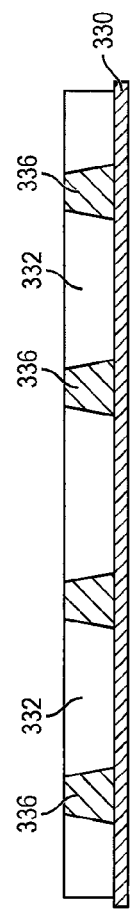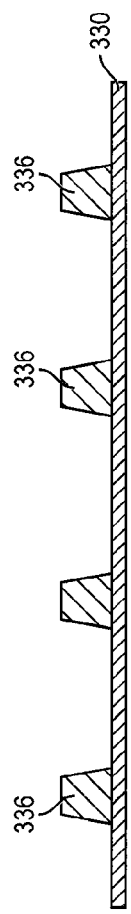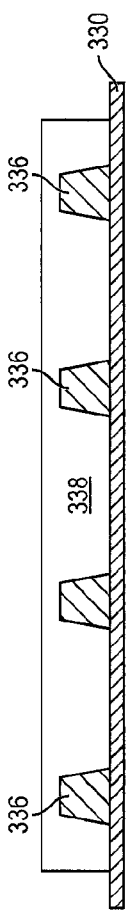

US 9,679,863 B2

SEMICONDUCTOR DEVICE AND METHOD OF FORMING INTERCONNECT SUBSTRATE FOR FO-WLCSP

FIELD OF THE INVENTION

The present invention relates in general to semiconductor devices and, more particularly, to a semiconductor device and method of forming an interconnect substrate for a Fo-WLCSP.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. The term "semiconductor die" as used herein refers to both the singular and plural form of the word, and accordingly, can refer to both a single semiconductor device and multiple semiconductor devices. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size can be achieved by improvements in the front-end process resulting in die with smaller, higher density active and passive components. Back-end processes may result in semiconductor device packages with a smaller footprint by improvements in electrical interconnection and packaging materials.

A conventional fan-out wafer level chip scale package (Fo-WLCSP) may contain a semiconductor die with bumps formed over contact pads on an active surface of the die. The semiconductor die is mounted to a substrate and covered with an encapsulant. Conductive vias or conductive pillars are formed through the encapsulant around the substrate for vertical electrical interconnect. The coefficient of thermal expansion (CTE) of the encapsulant is typically different than the CTE of the substrate. The CTE mismatch between the encapsulant and substrate causes stress during thermal cycling, leading to defects and higher manufacturing costs.

SUMMARY OF THE INVENTION

A need exists to reduce CTE mismatch between the encapsulant and substrate in a Fo-WLCSP. Accordingly, in one embodiment, the present invention is a method of making a semiconductor device comprising the steps of providing a first carrier, depositing a first encapsulant over the first carrier, forming a plurality of conductive vias through the first encapsulant to form an interconnect substrate, providing a second carrier, mounting first and second semiconductor die over the second carrier, mounting the interconnect substrate over the second carrier adjacent to the first and second semiconductor die, depositing a second encapsulant over the first and second semiconductor die, interconnect substrate, and second carrier, forming a first interconnect structure over a first surface of the second encapsulant and electrically connected to the conductive vias of the interconnect substrate, removing the second carrier, and forming a second interconnect structure over a second surface of the second encapsulant opposite the first surface of the second encapsulant and electrically connected to the conductive vias of the interconnect substrate.

In another embodiment, the present invention is a method of making a semiconductor device comprising the steps of forming an interconnect substrate having a plurality of conductive structures extending through the interconnect substrate, providing a first carrier, mounting the interconnect substrate over the first carrier, mounting a plurality of first semiconductor die over the first carrier adjacent to the interconnect substrate, depositing a first encapsulant over the first semiconductor die, interconnect substrate, and first carrier, and forming a first interconnect structure over a first surface of the first encapsulant and electrically connected to the conductive structures of the interconnect substrate.

In another embodiment, the present invention is a method of making a semiconductor device comprising the steps of forming an interconnect substrate having a plurality of conductive structures, disposing a first semiconductor die adjacent to the interconnect structure, depositing a first encapsulant over the first semiconductor die and interconnect substrate, and forming a first interconnect structure over a first surface of the first encapsulant and electrically connected to the conductive structures of the interconnect substrate.

In another embodiment, the present invention is a semiconductor device comprising an interconnect substrate having a plurality of conductive structures. A first semiconductor die is disposed adjacent to the interconnect structure. An encapsulant is deposited over the first semiconductor die and interconnect substrate. A first interconnect structure is formed over a first surface of the encapsulant and electrically connected to the conductive structures of the interconnect substrate.

BRIEF DESCRIPTION OF THE DRAWINGS

FIGS. 5a-5b illustrate the interconnect substrate with conductive TMV in a Fo-WLCSP according to FIGS. 4a-4r;

FIGS. 8a-8i illustrate another process of forming an interconnect substrate with conductive TMV for a Fo-WLCSP;

FIGS. 9a-9b illustrate the interconnect substrate with conductive TMV in a Fo-WLCSP according to FIGS. 8a-8i;

DETAILED DESCRIPTION OF THE DRAWINGS

Figure 1:
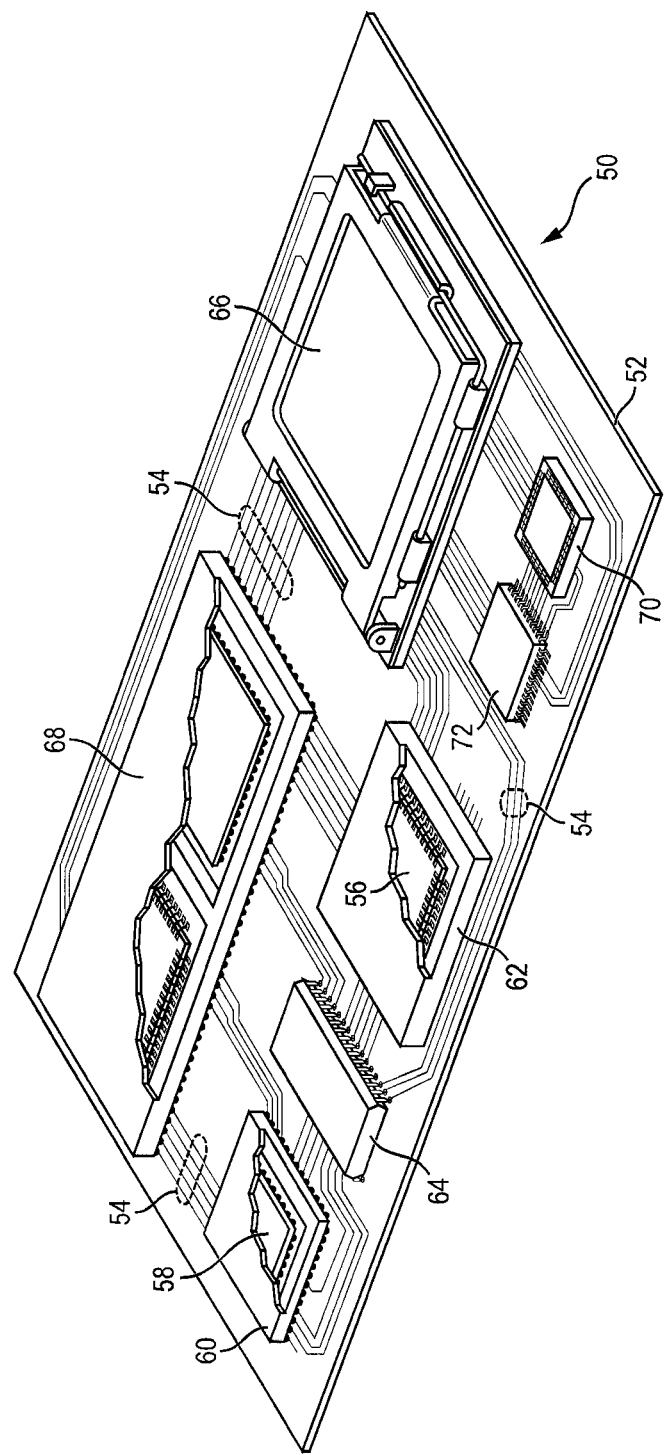
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
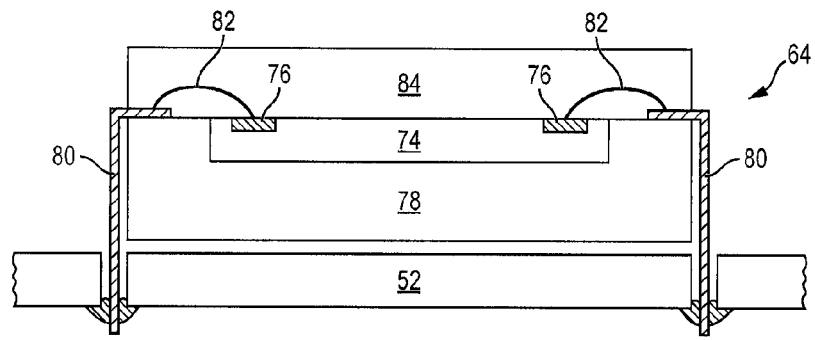
FIGS. 2a-2c illustrate further detail of the representative semiconductor packages mounted to the PCB.
Figure 2B:
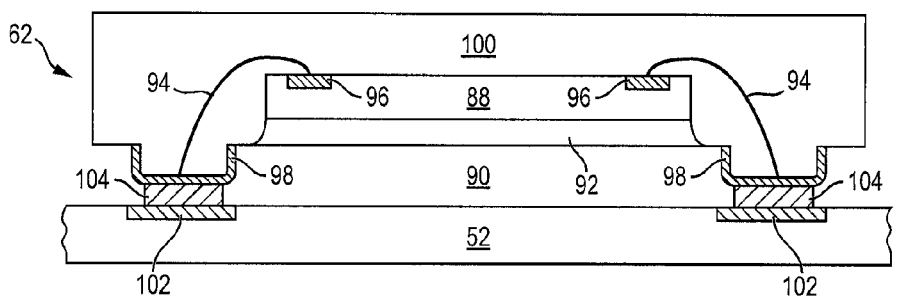
Figure 2C:
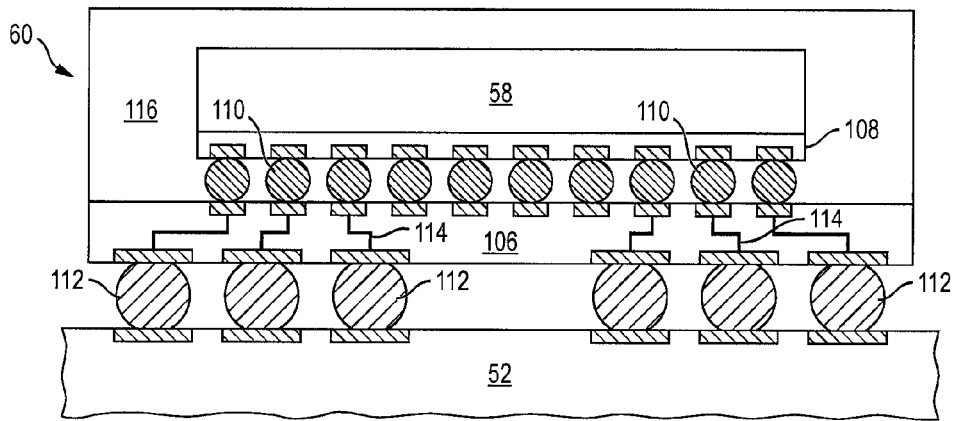

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
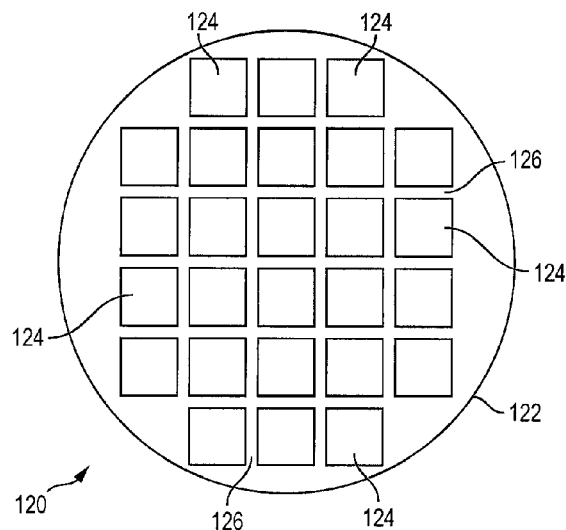
FIGS. 3a-3c illustrate a semiconductor wafer with a plurality of semiconductor die separated by a saw street.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by inter-die wafer area or saw streets 126 as described above. Saw streets 126 provide cutting areas to singulate semiconductor wafer 120 into individual semiconductor die 124.

Figure 3B:
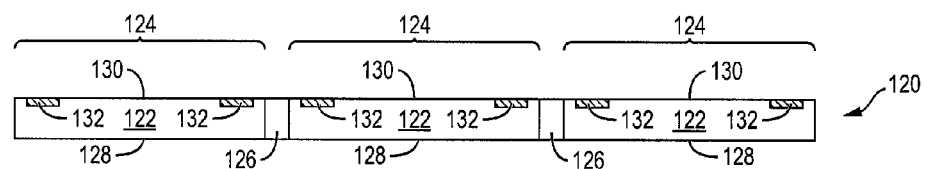

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type die.

An electrically conductive layer 132 is formed over active surface 130 using electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Contact pads 132 can be disposed side-by-side a first distance from the edge of semiconductor die 124, as shown in FIG. 4b. Alternatively, contact pads 132 can be offset in multiple rows such that a first row of contact pads is disposed a first distance from the edge of the die, and a second row of contact pads alternating with the first row is disposed a second distance from the edge of the die.

Figure 3C:
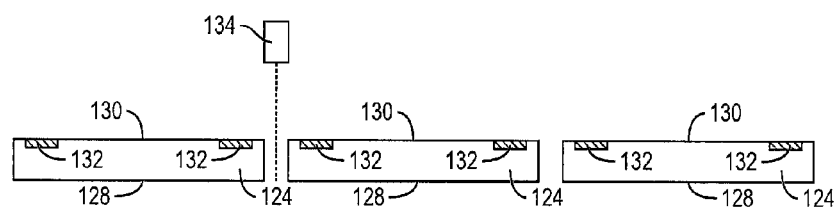

In FIG. 3c, semiconductor wafer 120 is singulated through saw street 126 using a saw blade or laser cutting tool 134 into individual semiconductor die 124.

FIGS. 4a-4r illustrate, in relation to FIGS. 1 and 2a-2c, a process of forming an interconnect substrate with conductive TMV for a Fo-WLCSP. In FIG. 4a, a temporary substrate or carrier 140 contains re-usable or sacrificial base material such as silicon, laminate, polymer composite with high content filler, polymer, beryllium oxide, glass, or other suitable low-cost, light-weight, rigid material for structural support. An interface layer or double-sided tape 142 is formed over carrier 140 as a temporary adhesive bonding film, etch-stop layer, or releasing layer.

An encapsulant or molding compound is deposited over interface layer 142 and carrier 140 using a paste printing, compressive molding, transfer molding, liquid encapsulant molding, vacuum lamination, spin coating, or other suitable applicator. The encapsulant can be one or more layers of polymer composite material, such as epoxy resin with filler, epoxy acrylate with filler, polymer with proper filler, or inorganic material with filler. In one embodiment, the encapsulant contains greater than 51% silica filler and optional carbon filler. The encapsulant operates as a non-conductive substrate 144 with surfaces 146 and 148 and a thickness of 100-450 micrometers (μm) for structural support.

In FIG. 4b a plurality of vias 150 is formed through substrate 144 using ultraviolet (UV) or infrared (IR) laser drilling or mechanical drilling. The encapsulant material body eases the drilling process through substrate 144. Vias 150 extend from surface 146 to surface 148 of substrate 144 with a width of about 50-350 μm. Carrier 140 and interface layer 142 are removed by thermal or laser release prior to or after formation of vias 150.

In FIG. 4c, an electrically conductive layer or RDL 152 is conformally applied over surfaces 146 and 148 of substrate 144 and sidewalls of vias 150 using electroless plating followed by electrolytic plating. Conductive layer 152 can be one or more layers of Cu, Sn, Ni, or other suitable electrically conductive material. The portion of conductive layer 152 formed on the sidewalls of vias 150 constitute z-direction vertical interconnect conductive through mold vias (TMV) 154.

Figure 4E:
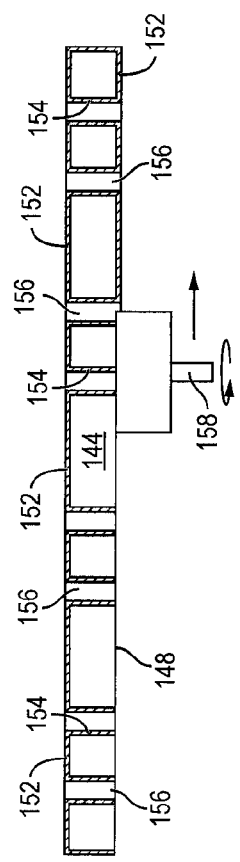
FIGS. 4a-4r illustrate a process of forming an interconnect substrate with conductive vias for a Fo-WLCSP.

In FIG. 4d, an insulating or dielectric layer 156 is formed within vias 150 by vacuum plugging. The insulating layer 156 can be an epoxy base composite with filler. A portion of conductive layer 152 and insulating layer 156 is removed by an etching or back grinding process to expose surface 148 of substrate 144. FIG. 4e shows grinder 158 removing a portion of conductive layer 152 and insulating layer 156 over surface 148 of substrate 144. A portion of conductive layer 152 can be removed by an etching process through a patterned photoresist layer (not shown) to electrically isolate the remaining portions of conductive layer 152 over surface 146 of substrate 144.

Figure 4F:
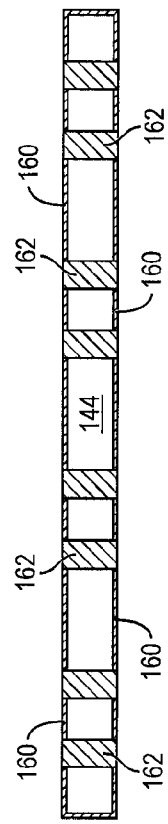
Figure 4G:
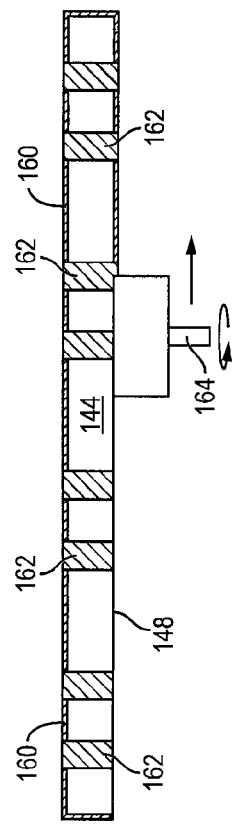

In another embodiment continuing from FIG. 4b, an electrically conductive layer or RDL 160 is formed over surfaces 146 and 148 of substrate 144 using electroless Cu plating followed by electrolytic Cu plating to completely fill the via, as shown in FIG. 4f. Alternatively, vias 150 are completely filled with a conductive material or conductive paste to form z-direction vertical interconnect conductive TMV 162. A portion of conductive layer 160 is removed by an etching or back grinding process to expose surface 148 of substrate 144. FIG. 4g shows grinder 164 removing a portion of conductive layer 160 over surface 148 of substrate 144. A portion of conductive layer 160 can be removed by an etching process through a patterned photoresist layer to electrically isolate the remaining portions of conductive layer 160 over surface 146 of substrate 144.

Conductive layers 152 and 160 can be formed prior to removing carrier 140 and interface layer 142. Conductive TMV 154 and 162 are formed, similar to FIGS. 4d and 4f, with substrate 144 disposed over carrier 140. Carrier 140 and interface layer 142 are removed after forming conductive layers 152 and 160 and conductive TMV 154 and 162. In this case, the backgrinding of conductive layers 152 and 160, as described in FIGS. 4e and 4g, can be eliminated as carrier 140 and interface layer 142 inhibit formation of a conductive layer over surface 148 of substrate 144.

Figure 4H:
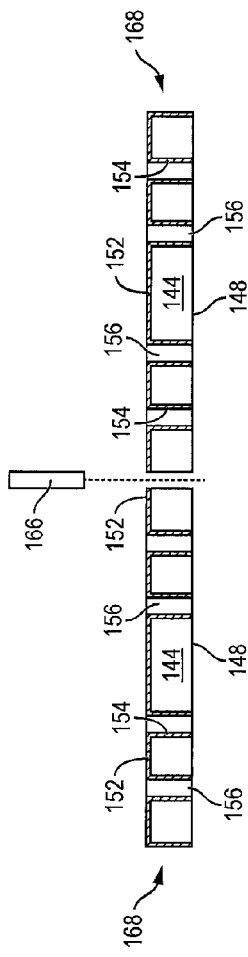

Continuing from FIG. 4e, substrate 144 is singulated with saw blade or laser cutting tool 166 into individual TMV interconnect substrates 168, as shown in FIG. 4h.

Figure 4I:
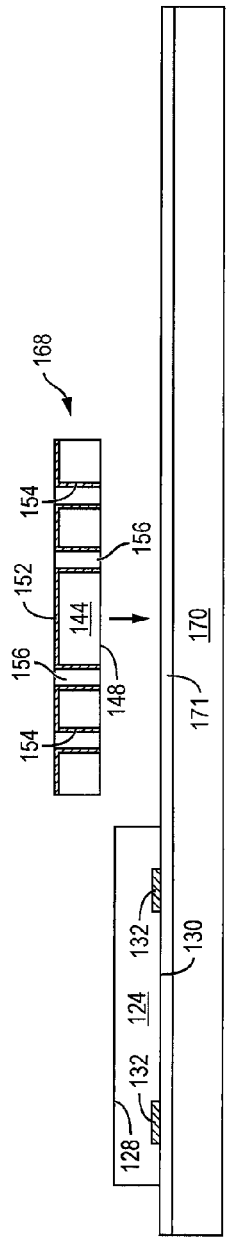

In FIG. 4i, a temporary substrate or carrier 170 contains re-usable or sacrificial base material such as silicon, laminate, polymer composite with high content filler, polymer, beryllium oxide, glass, or other suitable low-cost, light-weight, rigid material for structural support. An interface layer or double-sided tape 171 is formed over carrier 170 as a temporary adhesive bonding film, etch-stop layer, or releasing layer. Semiconductor die 124 from FIGS. 3*a*-3*c* is mounted to interface layer 171 using a pick and place operation with active surface 130 oriented toward carrier 170. TMV interconnect substrate 168 is mounted to interface layer 171 adjacent to semiconductor die 124 using a pick and place operation with surface 148 oriented toward carrier 170. Surface 148 of substrate 144, without conductive layer 152 or 160, readily bonds to interface layer 171.

Figure 4J:
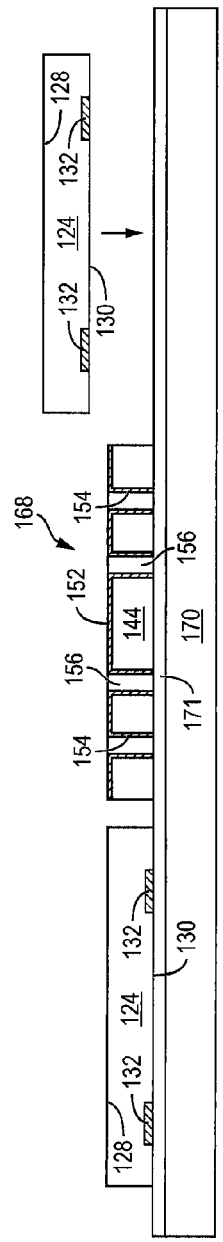
Figure 4K:
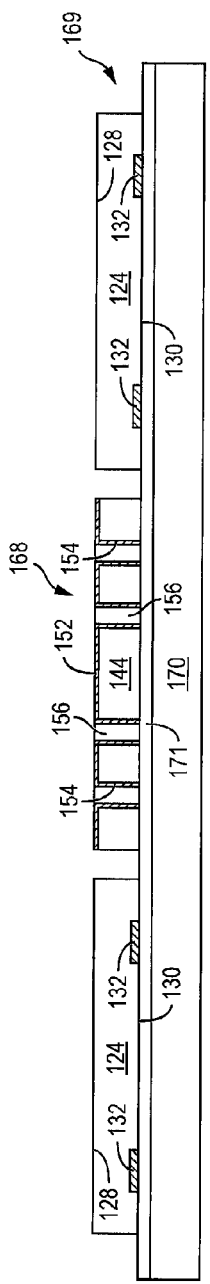

In FIG. 4*j*, semiconductor die 124 from FIGS. 3*a*-3*c* is mounted to interface layer 171 adjacent to a side of TMV interconnect substrate 168 opposite other semiconductor die 124 using a pick and place operation with active surface 130 oriented toward carrier 170. FIG. 4*k* shows semiconductor die 124 and TMV interconnect substrate 168 mounted to interface layer 171 and carrier 170 with the semiconductor die on opposite sides of the TMV interconnect substrate. TMV interconnect substrate 168 can have a shape corresponding to the layout of semiconductor die 124. For example, TMV interconnect substrate 168 is cut to fit between semiconductor die 124. Alternatively, TMV interconnect substrate 168 is cut to encircle semiconductor die 124, see FIG. 8*b*. Semiconductor die 124 and TMV interconnect substrate 168 mounted to carrier 170 is shown as reconstituted wafer 169. A TMV interconnect substrate 168 is disposed on both sides of each semiconductor die 124.

Figure 4L:
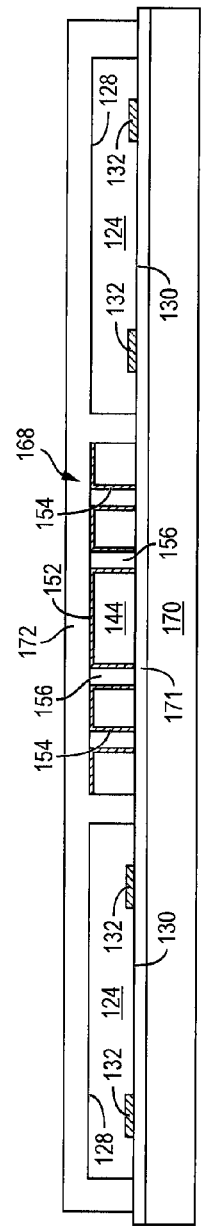

In FIG. 4*l*, an encapsulant or molding compound 172 is deposited over semiconductor die 124, TMV interconnect substrate 168, and carrier 170 using a paste printing, compressive molding, transfer molding, liquid encapsulant molding, vacuum lamination, spin coating, or other suitable applicator. Encapsulant 172 can be polymer composite material, such as epoxy resin with filler, epoxy acrylate with filler, polymer with proper filler, or inorganic material with filler. In one embodiment, encapsulant 172 contains greater than 51% silica filler and optional carbon filler. Encapsulant 172 is non-conductive and environmentally protects the semiconductor device from external elements and contaminants.

Figure 4M:
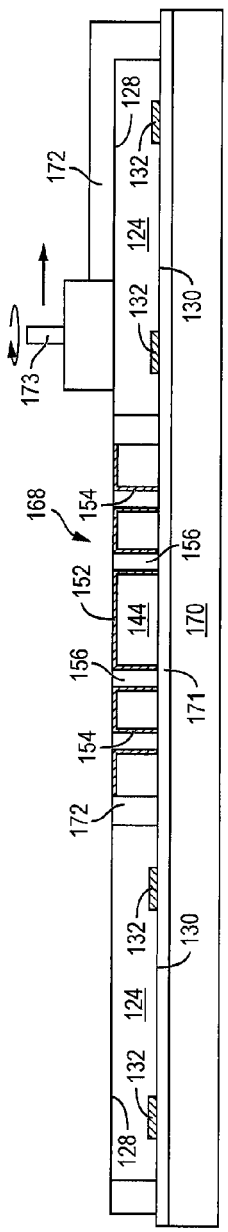

In FIG. 4*m*, a portion of encapsulant 172 is removed with grinder 173 and optional slurry polishing to planarize the encapsulant and expose conductive layer 152 of TMV interconnect substrate 168 and back surface 128 of semiconductor die 124. In another embodiment, conductive layer 152 is removed by the backgrinding process leaving conductive vias 154 through TMV interconnect substrate 168 for vertical connections.

Figure 4N:
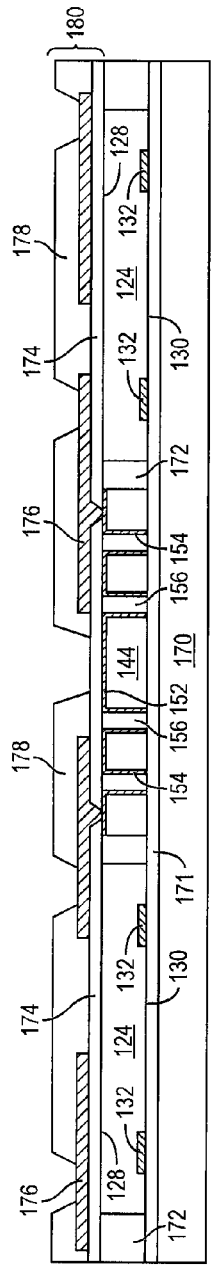

In FIG. 4*n*, an optional insulating or passivation layer 174 is formed over back surface 128 of semiconductor die 124, encapsulant 172, and TMV interconnect substrate 168 using lamination, printing, spin coating, or spray coating. The insulating layer 174 contains one or more layers of polyimide, epoxy, phenolic base polymer dielectric with or without filler, or other material having similar insulating and structural properties. A portion of insulating layer 174 is removed by an etching process through a patterned photoresist layer or laser direct ablation (LDA) to expose conductive layer 152.

An electrically conductive layer or RDL 176 is formed over insulating layer 174 and conductive layer 152 or conductive vias 154 using a patterning and metal deposition process such as sputtering, electrolytic plating, and electroless plating. Conductive layer 176 can be one or more layers of Al, Cu, Sn, Ni, Au, Ag, or other suitable electrically conductive material. One portion of conductive layer 176 is electrically connected to conductive layer 152 and conductive TMV 154. Other portions of conductive layer 176 can be electrically common or electrically isolated depending on the design and function of semiconductor die 124.

An insulating or passivation layer 178 is formed over insulating layer 174 and conductive layer 176 using lamination, printing, spin coating, or spray coating. The insulating layer 178 contains one or more layers of polyimide, epoxy, phenolic base polymer dielectric with or without filler, or other material having similar insulating and structural properties. A portion of insulating layer 178 is removed by an etching process through a patterned photoresist layer or LDA to expose conductive layer 176 for additional electrical interconnect. The insulating layers 174 and 178 and conductive layer 176 constitute a build-up interconnect structure 180.

Figure 4O:
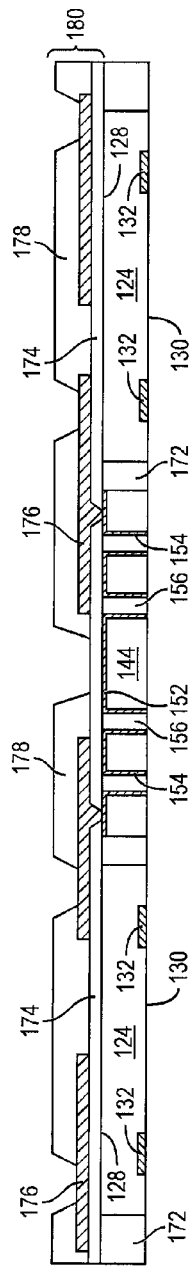
Figure 4P:
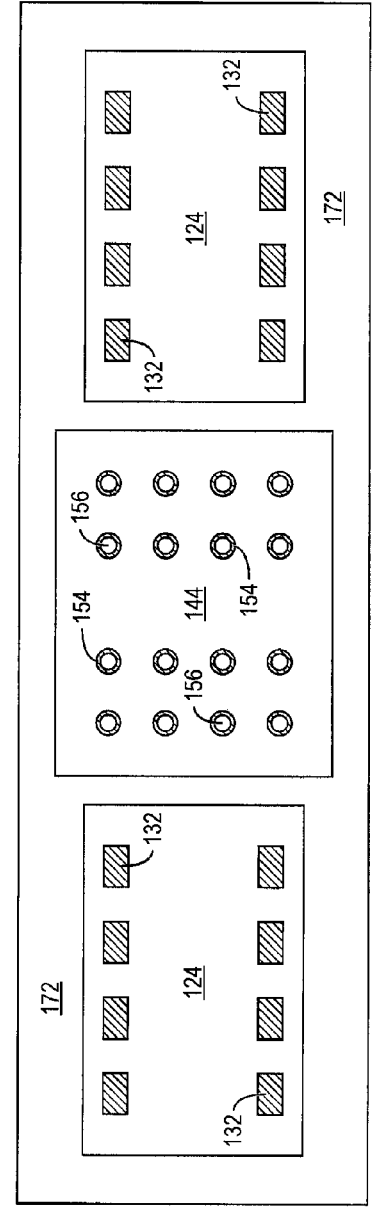

In FIG. 4*o*, carrier 170 and interface layer 171 are removed by chemical etching, mechanical peeling, CMP, mechanical grinding, thermal bake, UV light, laser scanning, or wet stripping to expose active surface 130, conductive layer 132, conductive TMV 154, and encapsulant 172. FIG. 4*p* shows a plan view of semiconductor die 124, TMV interconnect substrate 168 with conductive TMV 154, and encapsulant 172.

An optional supporting layer or substrate, like laminated rigid thermal tape resistance tape, silicon or glass, may be temporarily bonded on insulating layer 178 or build-up interconnect structure 180 to support the redistribution process at the other side of the device substrate.

In FIG. 4*q*, shown without a support carrier, an optional insulating or passivation layer 182 is formed over active surface 130 of semiconductor die 124, conductive layer 132, encapsulant 172, and surface 148 of TMV interconnect substrate 168 using lamination, printing, spin coating, or spray coating. The insulating layer 182 contains one or more layers of polyimide, epoxy, phenolic base polymer dielectric with or without filler, or other material having similar insulating and structural properties. A portion of insulating layer 182 is removed by an etching process through a patterned photoresist layer or LDA to expose conductive layer 132 and conductive TMV 154.

An electrically conductive layer or RDL 184 is formed over insulating layer 182, conductive layer 132, and conductive TMV 154 using a patterning and metal deposition process such as sputtering, electrolytic plating, and electroless plating. Conductive layer 184 can be one or more layers of Al, Cu, Sn, Ni, Au, Ag, or other suitable electrically conductive material. One portion of conductive layer 184 is electrically connected to conductive layer 132 and conductive TMV 154. Other portions of conductive layer 184 can be electrically common or electrically isolated depending on the design and function of semiconductor die 124.

An insulating or passivation layer 186 is formed over insulating layer 182 and conductive layer 184 using lamination, printing, spin coating, or spray coating. The insulating layer 186 contains one or more layers of polyimide, epoxy, phenolic base polymer dielectric with or without filler, or other material having similar insulating and structural properties. A portion of insulating layer 186 is removed by an etching process through a patterned photoresist layer or LDA to expose conductive layer 184 for additional electrical interconnect.

In FIG. 4*r*, an electrically conductive bump material is deposited over the exposed portion of conductive layer 184 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 184 using a suitable attachment or bonding process. In one embodiment, the bump material is reflowed by heating the material above its melting point to form round or spherical balls or bumps 188. In some applications, bumps 188 are reflowed a second time to improve electrical contact to conductive layer 184. An under bump metallization (UBM) layer can be formed under bumps 188. Bumps 188 can also be compression bonded to conductive layer 184. Bumps 188 represent one type of interconnect structure that can be formed over conductive layer 184. The interconnect structure can also use stud bump, micro bump, or other electrical interconnect. The insulating layers 182 and 186, conductive layer 184, and bumps 188 constitute a build-up interconnect structure 190.

In another embodiment, the redistribution process can be reversed with build-up interconnect structure 190 formed first after debonding, and then forming build-up interconnect structure 180.

The reconstituted wafer 169 with embedded semiconductor die 124 and TMV interconnect substrate 168 is singulated through substrate 144, encapsulant 172, and build-up interconnect structures 180 and 190 with saw blade or laser cutting tool 192 into individual stackable Fo-WLCSP 194. FIG. 5a shows a cross-sectional view of Fo-WLCSP 194 after singulation. Semiconductor die 124 is electrically connected through conductive layers 132 and 184 to bumps 188. Semiconductor die 124 is also electrically connected through conductive layer 184 and conductive TMV 154 to conductive layer 176. FIG. 5b shows a plan view of semiconductor die 124, TMV interconnect substrate 168 with conductive TMV 154, conductive layer 184, and encapsulant 172. TMV interconnect substrate 168 provides electrical interconnect capability on opposing sides of semiconductor die 124. TMV interconnect substrate 168 provides electrical interconnect capability on opposing sides of semiconductor die 124. TMV interconnect substrate 168 is fabricated with encapsulant or insulating materials having similar properties as encapsulant 172. For example, TMV interconnect substrate 168 and encapsulant 172 each contain an epoxy resin with 50-80% silica filler to make the CTE of the TMV interconnect substrate similar to the CTE of encapsulant 172 and reduce stress between the structures during thermal cycling. The reduction of stress between TMV interconnect substrate 168 and encapsulant 172 maintains structural integrity with good electrical isolation.

Figure 6A:
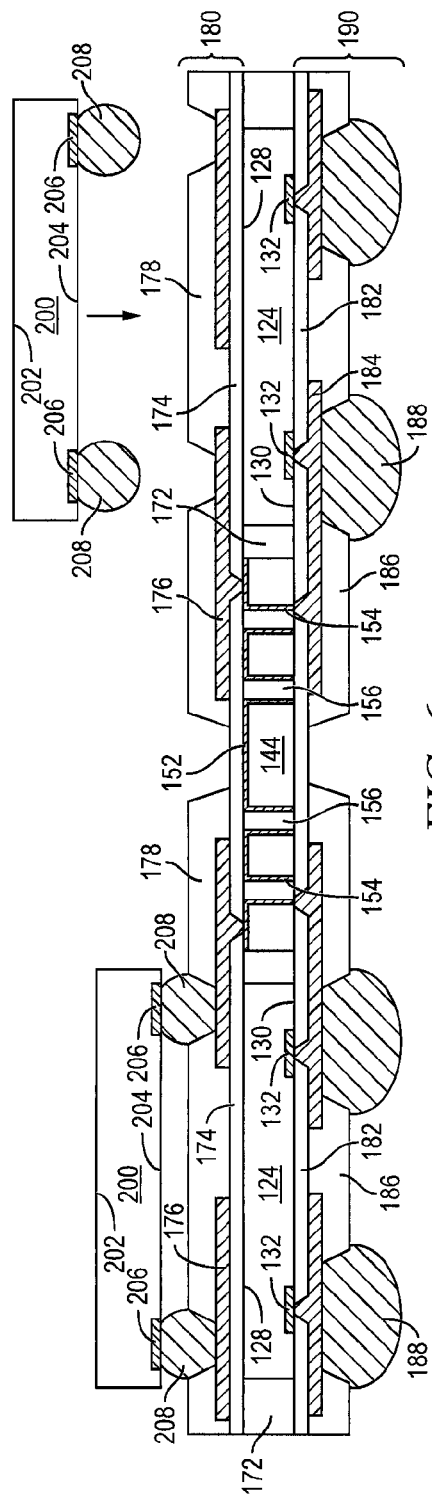
FIGS. 6a-6b illustrate a process of forming interconnect substrate with conductive TMV for a Fo-WLCSP in a PoP configuration.
Figure 6B:
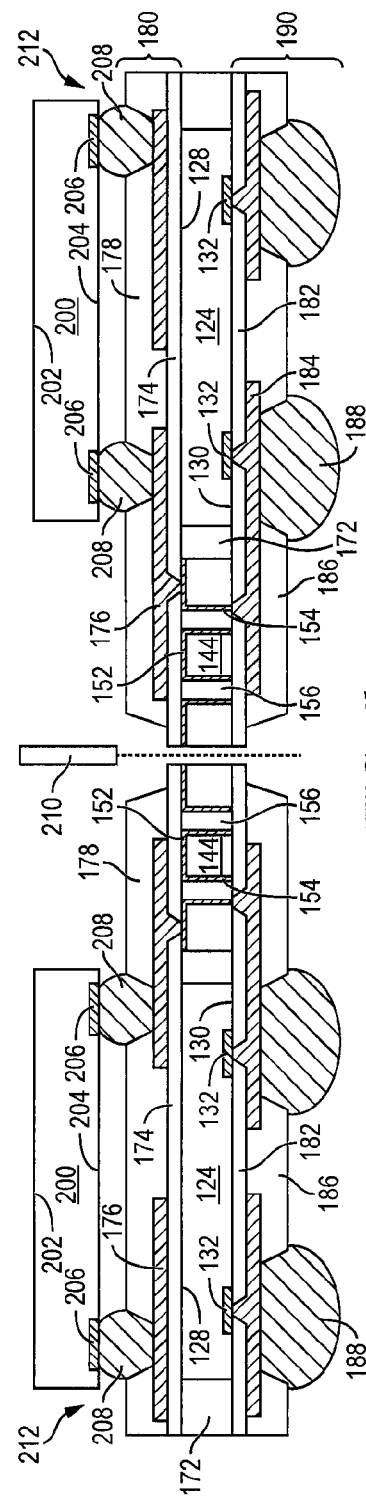

FIGS. 6a-6b illustrate a process of forming an interconnect substrate with conductive TMV for a Fo-WLCSP in a semiconductor package-on-package (PoP) arrangement. Continuing from FIG. 4q, semiconductor die 200 originating from a semiconductor wafer, similar to FIGS. 3a-3c, has a back surface 202 and active surface 204 containing analog or digital circuits implemented as active devices, passive devices, conductive layers, and dielectric layers formed within the die and electrically interconnected according to the electrical design and function of the die, as shown in FIG. 6a. For example, the circuit may include one or more transistors, diodes, and other circuit elements formed within active surface 204 to implement analog circuits or digital circuits, such as DSP, ASIC, memory, or other signal processing circuit. Semiconductor die 200 may also contain IPDs, such as inductors, capacitors, and resistors, for RF signal processing. A plurality of contact pads 206 is formed over active surface 204 and electrically connected to the circuits on the active surface. A plurality of bumps 208 is formed over contact pads 206. In one embodiment, semiconductor die 200 is flipchip type semiconductor die.

Semiconductor die 200 are mounted to conductive layer 176 using a pick and place operation with active surface 204 oriented toward build-up interconnect structure 180. Semiconductor die 200 can be mounted before or after singulation into Fo-WLCSP 194. Bumps 208 are reflowed to electrically connect contact pads 206 to conductive layer 176 of build-up interconnect structure 180. FIG. 6b shows semiconductor die 200 metallurgically and electrically connected to conductive layer 176 at the reconstituted wafer level.

Figure 7:
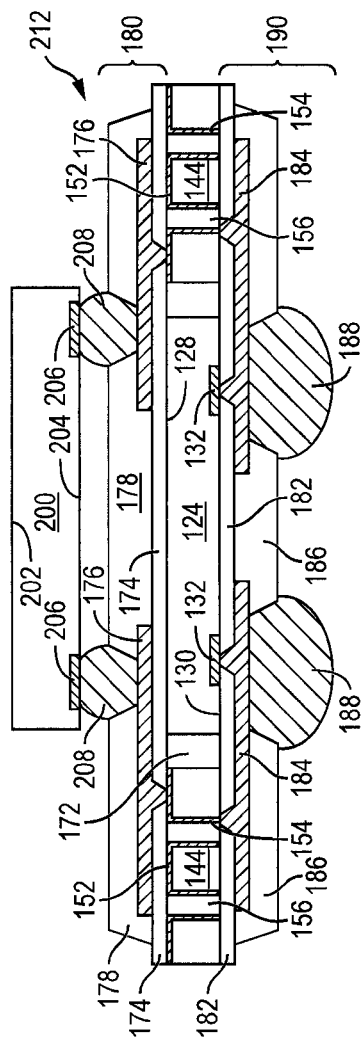
FIG. 7 illustrates the Fo-WLCSP and interconnect structure with conductive TMV in a PoP.

The assembly shown in FIG. 6b is singulated through substrate 144 and build-up interconnect structures 180 and 190 with saw blade or laser cutting tool 210 into individual semiconductor package-on-package (PoP) 212. FIG. 7 shows semiconductor PoP 212 after singulation. Semiconductor die 124 is electrically connected through conductive layers 132 and 184 to bumps 188. Semiconductor die 124 is also electrically connected through conductive layer 184 and conductive TMV 154 to conductive layer 176. Semiconductor die 200 is electrically connected through bumps 208, conductive layer 176, conductive TMV 154, and conductive layer 184 to semiconductor die 124 and bumps 188. TMV interconnect substrate 168 provides electrical interconnect capability on opposing sides of semiconductor die 124. TMV interconnect substrate 168 is fabricated with encapsulant or insulating materials having similar properties as encapsulant 172 to make the CTE of the TMV interconnect substrate similar to the CTE of encapsulant 172 and reduce stress between the structures during thermal cycling. The reduction of stress between TMV interconnect substrate 168 and encapsulant 172 maintains structural integrity with good electrical isolation.

Figure 8A:
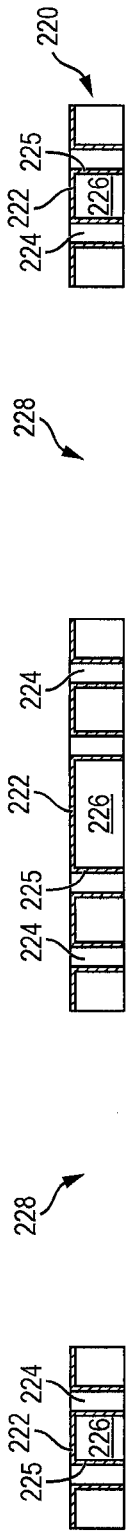
Figures 8B, 8C:
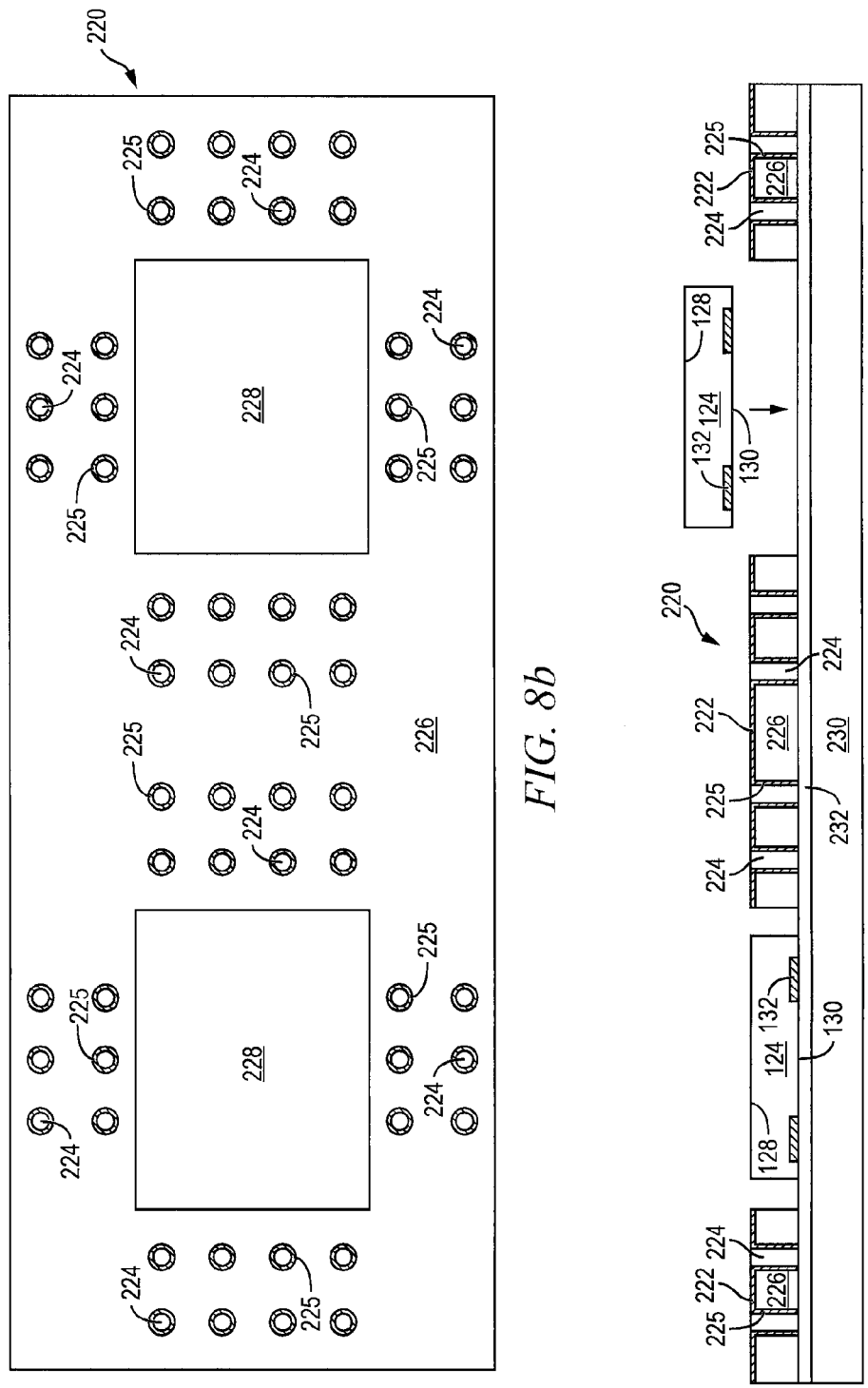

FIGS. 8a-8i illustrate, in relation to FIGS. 1 and 2a-2c, another process of forming an interconnect substrate with conductive TMV for a Fo-WLCSP. FIG. 8a shows a TMV interconnect substrate 220 with conductive layer 222 formed over encapsulant 226 and conductive TMV 225 formed through the encapsulant, as described in FIGS. 4a-4h. An insulating core 224 is deposited within the vias of encapsulant 226, similar to FIG. 4d. A plurality of openings 228 is formed in encapsulant 226 for disposing of semiconductor die 124. FIG. 8b shows a plan view of openings 228 in TMV interconnect substrate 220.

Figure 8D:
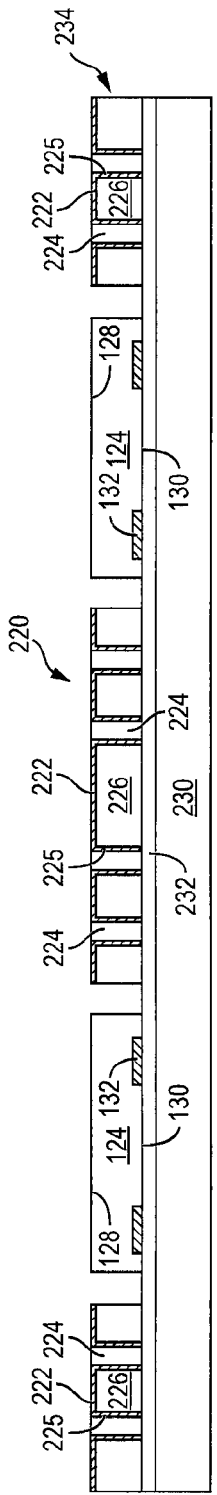

In FIG. 8c, a temporary substrate or carrier 230 contains re-usable or sacrificial base material such as silicon, laminate, polymer composite with high content filler, polymer, beryllium oxide, glass, or other suitable low-cost, lightweight, rigid material for structural support. An interface layer or double-sided tape 232 is formed over carrier 230 as a temporary adhesive bonding film, etch-stop layer, or releasing layer. TMV interconnect substrate 220 is mounted to interface layer 232. Semiconductor die 124 from FIGS. 3a-3c is mounted to interface layer 232 within openings 228 of TMV interconnect substrate 220 using a pick and place operation with active surface 130 oriented toward carrier 230. FIG. 8d shows semiconductor die 124 mounted to interface layer 232 and carrier 230 within openings 228 of TMV interconnect substrate 220. Semiconductor die 124 and TMV interconnect substrate 220 mounted to carrier 230 is shown as reconstituted wafer 234.

Figure 8E:
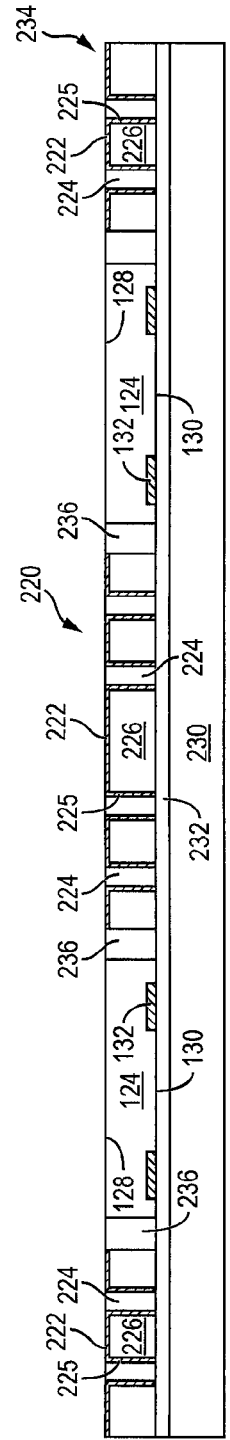

In FIG. 8e, an encapsulant or molding compound 236 is deposited over semiconductor die 124, TMV interconnect substrate 220, and carrier 230 using a paste printing, compressive molding, transfer molding, liquid encapsulant molding, vacuum lamination, spin coating, or other suitable applicator, similar to FIG. 4l. Encapsulant 236 can be polymer composite material, such as epoxy resin with filler, epoxy acrylate with filler, polymer with proper filler, or inorganic material with filler. In one embodiment, encapsulant 236 contains greater than 51% silica filler and optional carbon filler. Encapsulant 236 is non-conductive and environmentally protects the semiconductor device from external elements and contaminants. A portion of encapsulant 236 can be removed with a grinder and optional slurry polishing to planarize the encapsulant and expose back surface 128 of semiconductor die 124 and TMV interconnect substrate 220, similar to FIG. 4m.

Figure 8F:
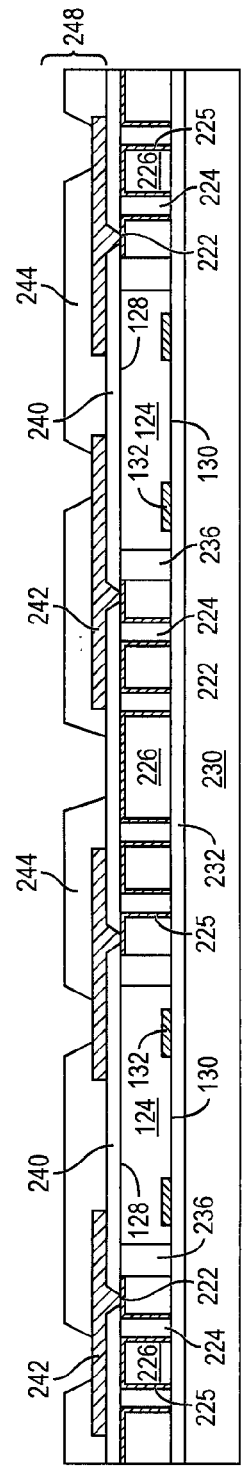

In FIG. 8f, an optional insulating or passivation layer 240 is formed over back surface 128 of semiconductor die 124, TMV interconnect substrate 220, and encapsulant 236 using lamination, printing, spin coating, or spray coating. The insulating layer 240 contains one or more layers of polyimide, epoxy, phenolic base polymer dielectric with or without filler, or other material having similar insulating and structural properties. A portion of insulating layer 240 is removed by an etching process through a patterned photoresist layer or LDA to expose conductive layer 222.

An electrically conductive layer or RDL 242 is formed over insulating layer 240 and conductive layer 222 using a patterning and metal deposition process such as sputtering, electrolytic plating, and electroless plating. Conductive layer 242 can be one or more layers of Al, Cu, Sn, Ni, Au, Ag, or other suitable electrically conductive material. One portion of conductive layer 242 is electrically connected to conductive layer 222 and conductive TMV 225. Other portions of conductive layer 242 can be electrically common or electrically isolated depending on the design and function of semiconductor die 124.

An insulating or passivation layer 244 is formed over insulating layer 240 and conductive layer 242 using lamination, printing, spin coating, or spray coating. The insulating layer 244 contains one or more layers of polyimide, epoxy, phenolic base polymer dielectric with or without filler, or other material having similar insulating and structural properties. A portion of insulating layer 244 is removed by an etching process through a patterned photoresist layer or LDA to expose conductive layer 242 for additional electrical interconnect. The insulating layers 240 and 244 and conductive layer 242 constitute a build-up interconnect structure 248.

Figure 8G:
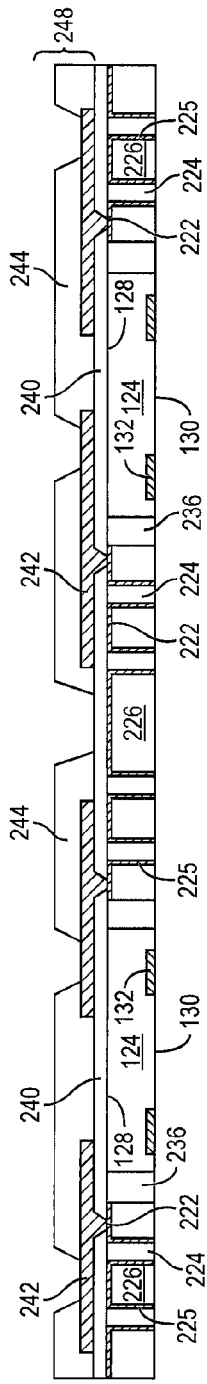
Figure 8H:
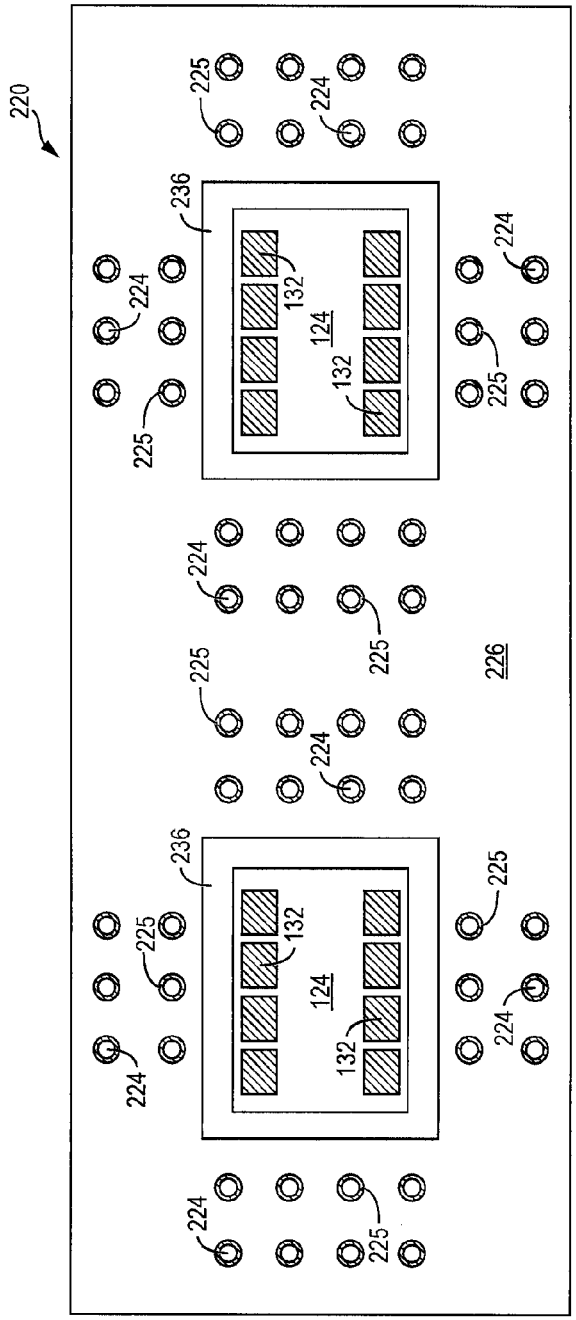

In FIG. 8g, carrier 230 and interface layer 232 are removed by chemical etching, mechanical peeling, CMP, mechanical grinding, thermal bake, UV light, laser scanning, or wet stripping to expose active surface 130, conductive layer 132, TMV interconnect substrate 220, and encapsulant 236. FIG. 8h shows a plan view of semiconductor die 124, TMV interconnect substrate 220 with conductive TMV 225, and encapsulant 236.

In FIG. 8i, an optional insulating or passivation layer 250 is formed over active surface 130 of semiconductor die 124, conductive layer 132, TMV interconnect substrate 220, and encapsulant 236 using lamination, printing, spin coating, or spray coating. The insulating layer 250 contains one or more layers of polyimide, epoxy, phenolic base polymer dielectric with or without filler, or other material having similar insulating and structural properties. A portion of insulating layer 250 is removed by an etching process through a patterned photoresist layer or LDA to expose conductive layer 132 and conductive TMV 225.

An electrically conductive layer or RDL 252 is formed over insulating layer 250, conductive layer 132, and conductive TMV 225 using a patterning and metal deposition process such as sputtering, electrolytic plating, and electroless plating. Conductive layer 252 can be one or more layers of Al, Cu, Sn, Ni, Au, Ag, or other suitable electrically conductive material. One portion of conductive layer 252 is electrically connected to conductive layer 132 and conductive TMV 225. Other portions of conductive layer 252 can be electrically common or electrically isolated depending on the design and function of semiconductor die 124.

An insulating or passivation layer 254 is formed over insulating layer 250 and conductive layer 252 using lamination, printing, spin coating, or spray coating. The insulating layer 254 contains one or more layers of polyimide, epoxy, phenolic base polymer dielectric with or without filler, or other material having similar insulating and structural properties. A portion of insulating layer 254 is removed by an etching process through a patterned photoresist layer or LDA to expose conductive layer 252 for additional electrical interconnect.

An electrically conductive bump material is deposited over the exposed portion of conductive layer 252 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 252 using a suitable attachment or bonding process. In one embodiment, the bump material is reflowed by heating the material above its melting point to form balls or bumps 256. In some applications, bumps 256 are reflowed a second time to improve electrical contact to conductive layer 256. A UBM layer can be formed under bumps 256. Bumps 256 can also be compression bonded to conductive layer 252. Bumps 256 represent one type of interconnect structure that can be formed over conductive layer 252. The interconnect structure can also use stud bump, micro bump, or other electrical interconnect. The insulating layers 250 and 254, conductive layer 252, and bumps 256 constitute a build-up interconnect structure 258.

In another embodiment, the redistribution process can be reversed with build-up interconnect structure 258 formed first after debonding, and then forming build-up interconnect structure 248.

The reconstituted wafer 234 is singulated through TMV interconnect substrate 220 and build-up interconnect structures 248 and 258 with saw blade or laser cutting tool 260 into individual stackable Fo-WLCSP 262. FIG. 9a shows a cross-sectional view of Fo-WLCSP 262 after singulation. Semiconductor die 124 is electrically connected through conductive layers 132 and 252 to bumps 256. Semiconductor die 124 is also electrically connected through conductive layer 252 and conductive TMV 225 to conductive layer 242. FIG. 9b shows a plan view of semiconductor die 124, TMV interconnect substrate 220 with conductive TMV 225, conductive layer 252, and encapsulant 236. TMV interconnect substrate 220 provides electrical interconnect capability on all sides of semiconductor die 124. TMV interconnect substrate 220 is fabricated with encapsulant or insulating materials having similar properties as encapsulant 236. For example, TMV interconnect substrate 220 and encapsulant 236 each contain an epoxy resin with 50-80% silica filler to make the CTE of the TMV interconnect substrate similar to the CTE of encapsulant 236 and reduce stress between the structures during thermal cycling. The reduction of stress between TMV interconnect substrate 220 and encapsulant 236 maintains structural integrity with good electrical isolation.

Figure 10K:
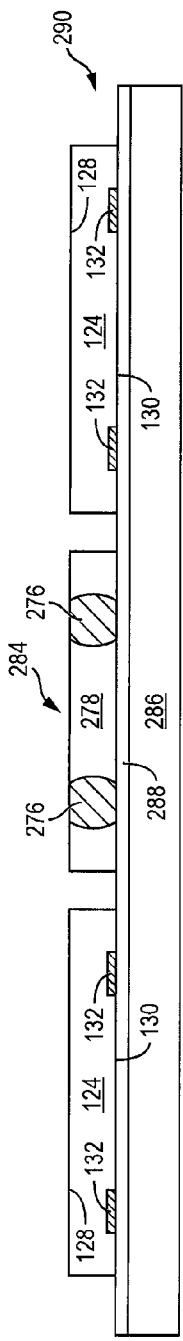
FIGS. 10a-10p illustrate a process of forming an interconnect substrate with rounded or spherical bumps for a Fo-WLCSP.
Figure 10L:
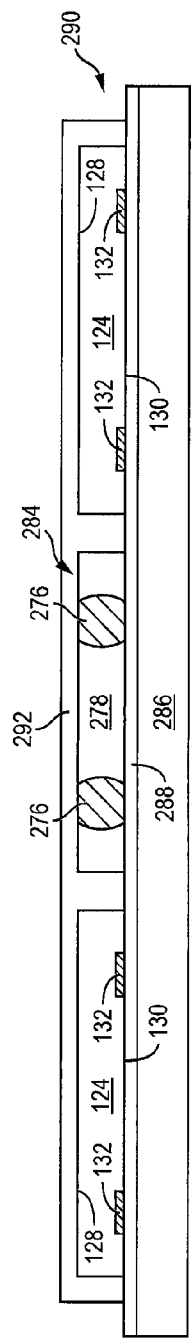
Figure 10M:
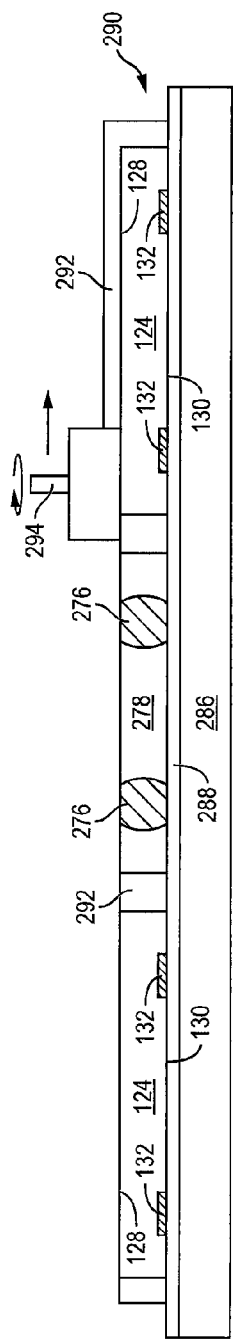
Figure 10N:
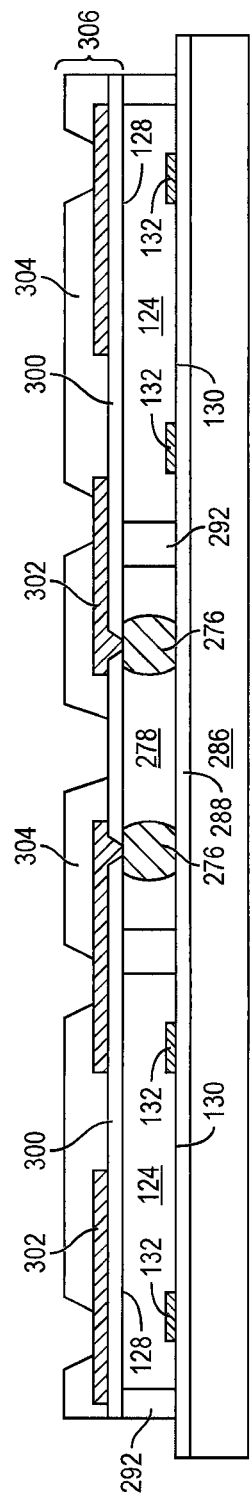
Figure 10O:
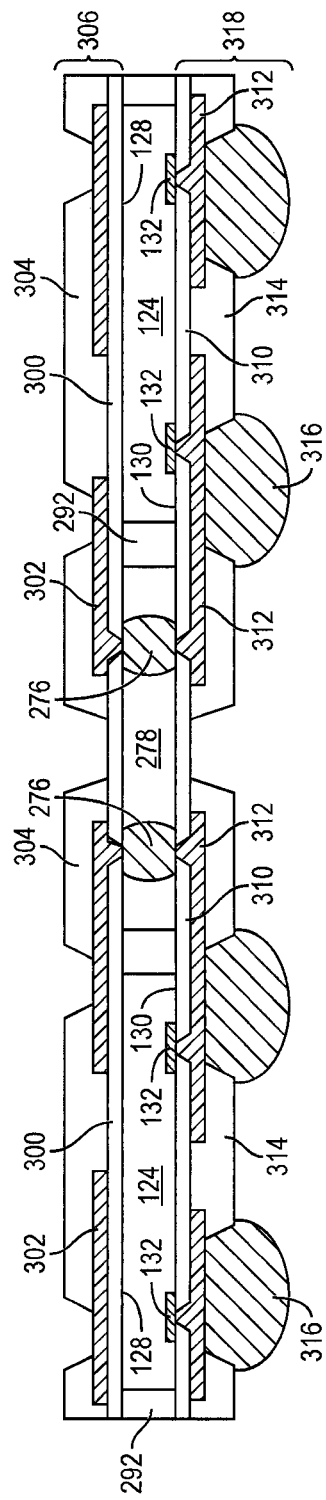
Figure 10P:
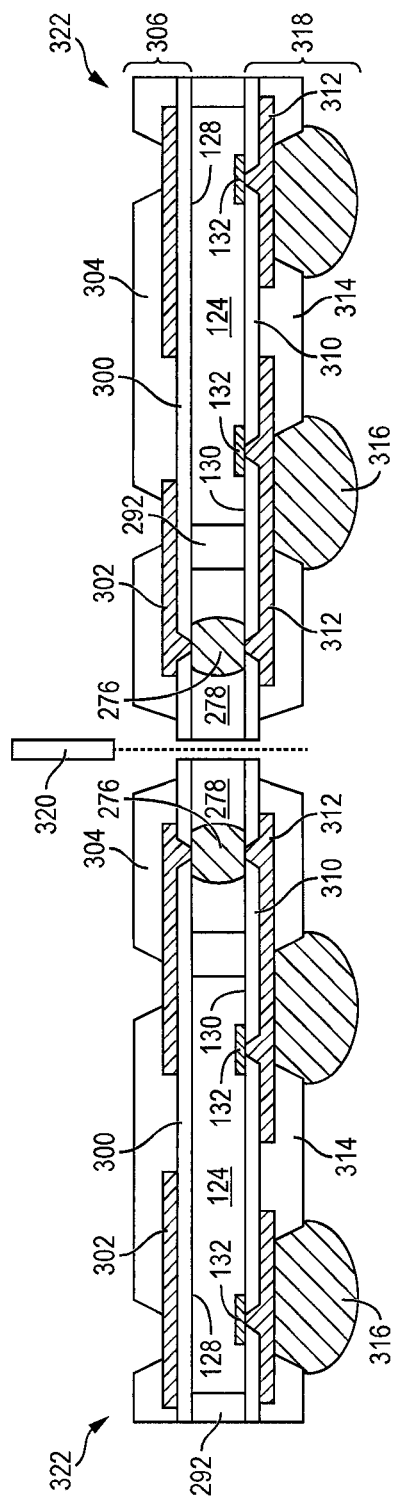

FIGS. 10a-10p illustrate, in relation to FIGS. 1 and 2a-2c, a process of forming an interconnect substrate with rounded or spherical bumps for a Fo-WLCSP. FIG. 10a shows conductive film 270 containing one or more layers of Al, Cu, Sn, Ni, Au, Ag, or other suitable electrically conductive material. A stencil 272 with openings 274 is disposed over conductive film 270.

In FIG. 10b, a flux material is deposited within openings 274. An electrically conductive bump material is deposited within openings 274 using an evaporation, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. In one embodiment, the bump material is reflowed by heating the material above its melting point, e.g., 265° C., to form rounded or spherical balls or bumps 276.

In FIG. 10c, stencil 272 is removed leaving bumps 276 disposed over conductive film 270.

In FIG. 10d, an encapsulant or molding compound 278 is deposited over conductive film 270 and bumps 276 using a paste printing, compressive molding, transfer molding, liquid encapsulant molding, vacuum lamination, spin coating, or other suitable applicator. Encapsulant 278 can be one or more layers of polymer composite material, such as epoxy resin with filler, epoxy acrylate with filler, polymer with proper filler, or inorganic material with filler. In one embodiment, encapsulant 278 contains greater than 51% silica filler and optional carbon filler. Encapsulant 278 operates as a non-conductive substrate with a thickness of 100-450 µm for structural support.

In FIG. 10e, a portion of encapsulant 278 is removed with grinder 280 to planarize the encapsulant and expose a surface of bumps 276. FIG. 10f shows a surface of bumps 276 exposed from encapsulant 278. A portion of conductive film 270 is removed by an etching process through a patterned photoresist layer to electrically isolate the remaining portions of the conductive film. Alternatively, conductive film 270 is completely removed to expose an opposite side of bumps 276, as shown in FIG. 10g.

In FIG. 10h, encapsulant 278 is singulated with saw blade or laser cutting tool 282 into individual interconnect substrates 284 with bumps 276 providing z-direction vertical electrical interconnect through the interconnect substrate.

In FIG. 10i, a temporary substrate or carrier 286 contains re-usable or sacrificial base material such as silicon, laminate, polymer composite with high content filler, polymer, beryllium oxide, glass, or other suitable low-cost, lightweight, rigid material for structural support. An interface layer or double-sided tape 288 is formed over carrier 286 as a temporary adhesive bonding film, etch-stop layer, or releasing layer. Semiconductor die 124 from FIGS. 3a-3c is mounted to interface layer 288 using a pick and place operation with active surface 130 oriented toward carrier 286. The interconnect substrate 284 is mounted to interface layer 288 adjacent to semiconductor die 124 using a pick and place operation.

In FIG. 10j, semiconductor die 124 from FIGS. 3a-3c is mounted to interface layer 288 adjacent to a side of interconnect substrate 284 opposite other semiconductor die 124 using a pick and place operation with active surface 130 oriented toward carrier 286. FIG. 10k shows semiconductor die 124 and interconnect substrate 284 mounted to interface layer 288 and carrier 286 with the semiconductor die on opposite sides of the interconnect substrate. The interconnect substrate 284 can have a shape corresponding to the layout of semiconductor die 124. For example, interconnect substrate 284 is cut to fit between semiconductor die 124. Alternatively, interconnect substrate 284 is cut to encircle semiconductor die 124, similar to FIG. 8b. Semiconductor die 124 and interconnect substrate 284 mounted to carrier 286 is shown as reconstituted wafer 290. An interconnect substrate 284 is disposed on both sides of each semiconductor die 124.

In FIG. 10l, an encapsulant or molding compound 292 is deposited over semiconductor die 124, interconnect substrate 284, and carrier 286 using a paste printing, compressive molding, transfer molding, liquid encapsulant molding, vacuum lamination, spin coating, or other suitable applicator. Encapsulant 292 can be polymer composite material, such as epoxy resin with filler, epoxy acrylate with filler, polymer with proper filler, or inorganic material with filler. In one embodiment, encapsulant 292 contains greater than 51% silica filler and optional carbon filler. Encapsulant 292 is non-conductive and environmentally protects the semiconductor device from external elements and contaminants.

In FIG. 10m, a portion of encapsulant 292 is removed with grinder 294 to planarize the encapsulant and expose interconnect substrate 284 and back surface 128 of semiconductor die 124.

In FIG. 10n, an optional insulating or passivation layer 300 is formed over back surface 128 of semiconductor die 124, encapsulant 292, and interconnect substrate 284 using lamination, printing, spin coating, or spray coating. The insulating layer 300 contains one or more layers of polyimide, epoxy, phenolic base polymer dielectric with or without filler, or other material having similar insulating and structural properties. A portion of insulating layer 300 is removed by an etching process through a patterned photoresist layer or LDA to expose bumps 276.

An electrically conductive layer or RDL 302 is formed over insulating layer 300 and bumps 276 using a patterning and metal deposition process such as sputtering, electrolytic plating, and electroless plating. Conductive layer 302 can be one or more layers of Al, Cu, Sn, Ni, Au, Ag, or other suitable electrically conductive material. One portion of conductive layer 302 is electrically connected to bumps 276. Other portions of conductive layer 302 can be electrically common or electrically isolated depending on the design and function of semiconductor die 124.

An insulating or passivation layer 304 is formed over insulating layer 300 and conductive layer 302 using lamination, printing, spin coating, or spray coating. The insulating layer 304 contains one or more layers of polyimide, epoxy, phenolic base polymer dielectric with or without filler, or other material having similar insulating and structural properties. A portion of insulating layer 304 is removed by an etching process through a patterned photoresist layer or LDA to expose conductive layer 302 for additional electrical interconnect. The insulating layers 300 and 304 and conductive layer 302 constitute a build-up interconnect structure 306.

In FIG. 10o, carrier 286 and interface layer 288 are removed by chemical etching, mechanical peeling, CMP, mechanical grinding, thermal bake, UV light, laser scanning, or wet stripping to expose active surface 130 of semiconductor die 124, conductive layer 132, interconnect substrate 284, and encapsulant 292.

An optional insulating or passivation layer 310 is formed over active surface 130 of semiconductor die 124, conductive layer 132, interconnect substrate 284, and encapsulant 292 using lamination, printing, spin coating, or spray coating. The insulating layer 310 contains one or more layers of polyimide, epoxy, phenolic base polymer dielectric with or without filler, or other material having similar insulating and structural properties. A portion of insulating layer 310 is removed by an etching process through a patterned photoresist layer or LDA to expose conductive layer 132 and bumps 276.

An electrically conductive layer or RDL 312 is formed over insulating layer 310, conductive layer 132, and bumps 276 using a patterning and metal deposition process such as sputtering, electrolytic plating, and electroless plating. Conductive layer 312 can be one or more layers of Al, Cu, Sn, Ni, Au, Ag, or other suitable electrically conductive material. One portion of conductive layer 312 is electrically connected to conductive layer 132 and bumps 276. Other portions of conductive layer 312 can be electrically common or electrically isolated depending on the design and function of semiconductor die 124.

An insulating or passivation layer 314 is formed over insulating layer 310 and conductive layer 312 using lamination, printing, spin coating, or spray coating. The insulating layer 314 contains one or more layers of polyimide, epoxy, phenolic base polymer dielectric with or without filler, or other material having similar insulating and structural properties. A portion of insulating layer 314 is removed by an etching process through a patterned photoresist layer or LDA to expose conductive layer 312 for additional electrical interconnect.

An electrically conductive bump material is deposited over the exposed portion of conductive layer 312 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 312 using a suitable attachment or bonding process. In one embodiment, the bump material is reflowed by heating the material above its melting point to form balls or bumps 316. In some applications, bumps 316 are reflowed a second time to improve electrical contact to conductive layer 312. A UBM layer can be formed under bumps 316. Bumps 316 can also be compression bonded to conductive layer 312. Bumps 316 represent one type of interconnect structure that can be formed over conductive layer 312. The interconnect structure can also use stud bump, micro bump, or other electrical interconnect. The insulating layers 310 and 314, conductive layer 312, and bumps 316 constitute a build-up interconnect structure 318.

In another embodiment, the redistribution process can be reversed with build-up interconnect structure 318 formed first after debonding, and then forming build-up interconnect structure 306.

In FIG. 10p, the reconstituted wafer 290 is singulated through interconnect substrate 284 and build-up interconnect structures 306 and 318 with saw blade or laser cutting tool 320 into individual stackable Fo-WLCSP 322.

Figure 11:
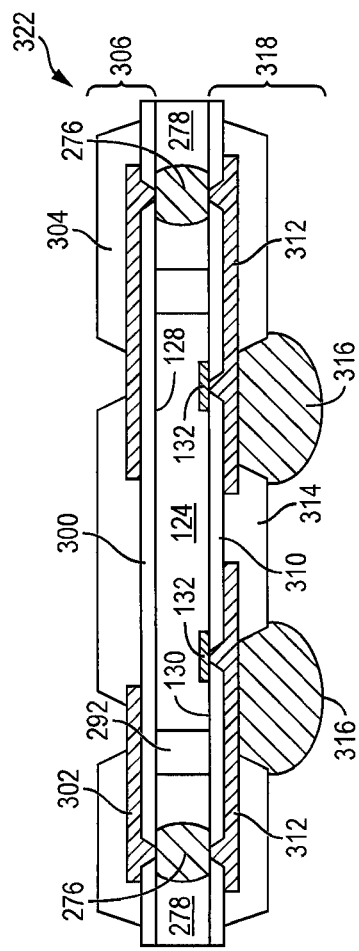
FIG. 11 illustrates the interconnect substrate with spherical bumps in a Fo-WLCSP according to FIGS. 10a-10p.

FIG. 11 shows Fo-WLCSP 322 after singulation. Semiconductor die 124 is electrically connected through conductive layers 132 and 312 to bumps 316. Semiconductor die is also electrically connected through conductive layer 312 and bumps 276 to conductive layer 302. The interconnect substrate 284 provides electrical interconnect capability on opposing sides of semiconductor die 124. The interconnect substrate 284 is fabricated with encapsulant or insulating materials having similar properties as encapsulant 292. For example, interconnect substrate 284 and encapsulant 292 each contain an epoxy resin with 50-80% silica filler to make the CTE of the interconnect substrate similar to the CTE of the encapsulant and reduce stress between the structures during thermal cycling. The reduction of stress between interconnect substrate 284 and encapsulant 292 maintains structural integrity with good electrical isolation.

Figure 12E:
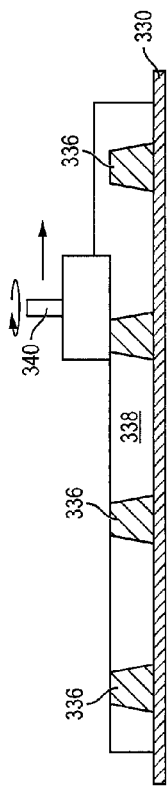
FIGS. 12a-12p illustrate a process of forming an interconnect substrate with trapezoid or polygon shaped bumps for a Fo-WLCSP.
Figure 12F:
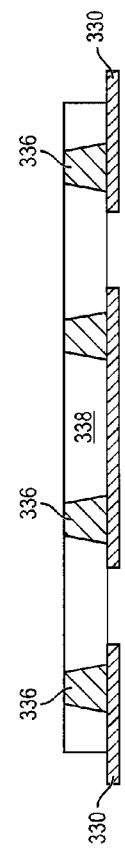
Figure 12G:
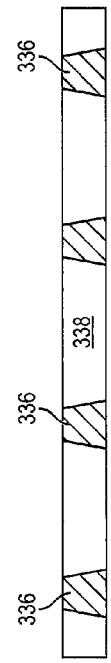
Figure 12H:
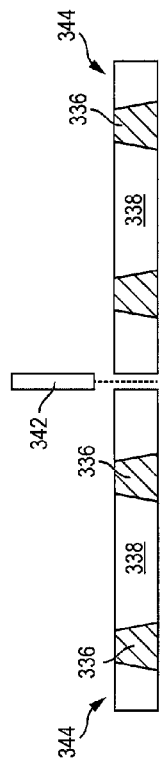
Figure 12I:
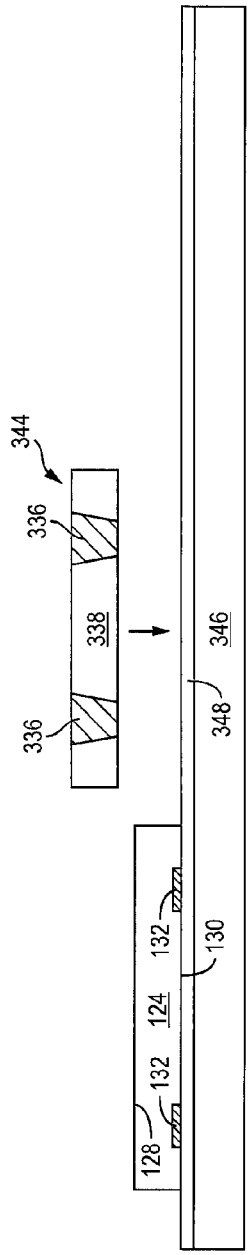
Figure 12J:
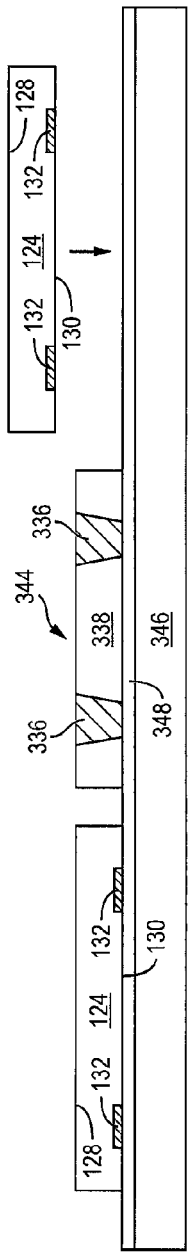
Figure 12K:
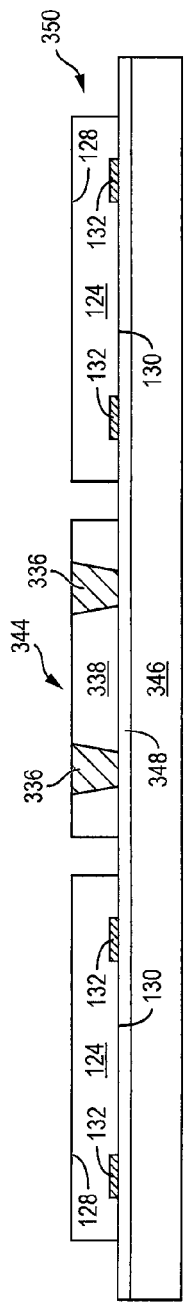
Figure 12L:
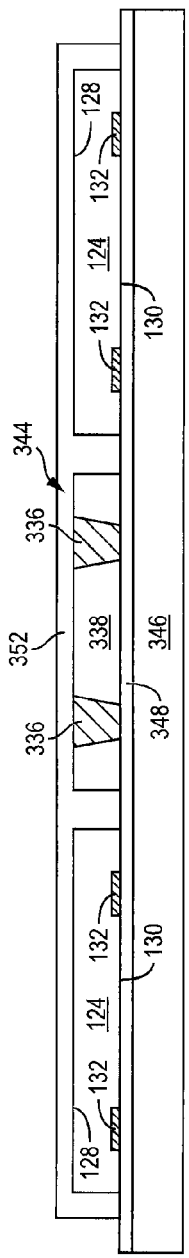
Figure 12M:
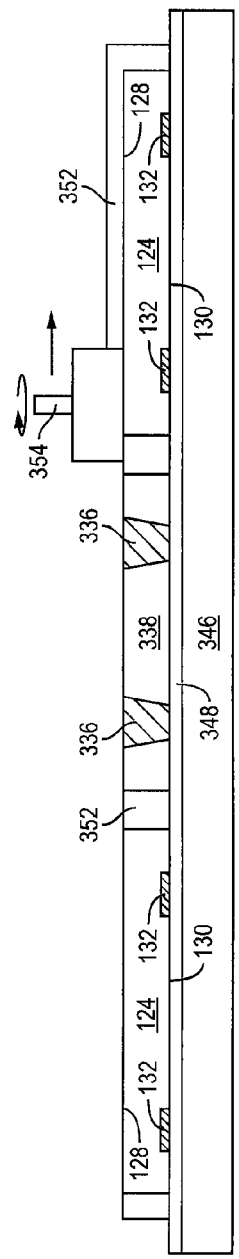
Figure 12N:
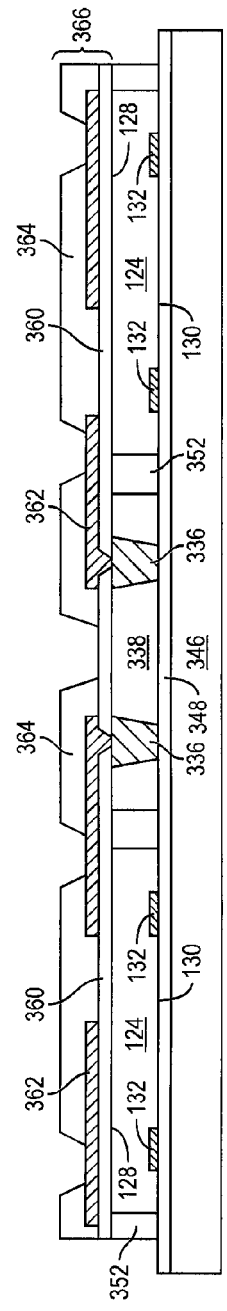
Figure 12O:
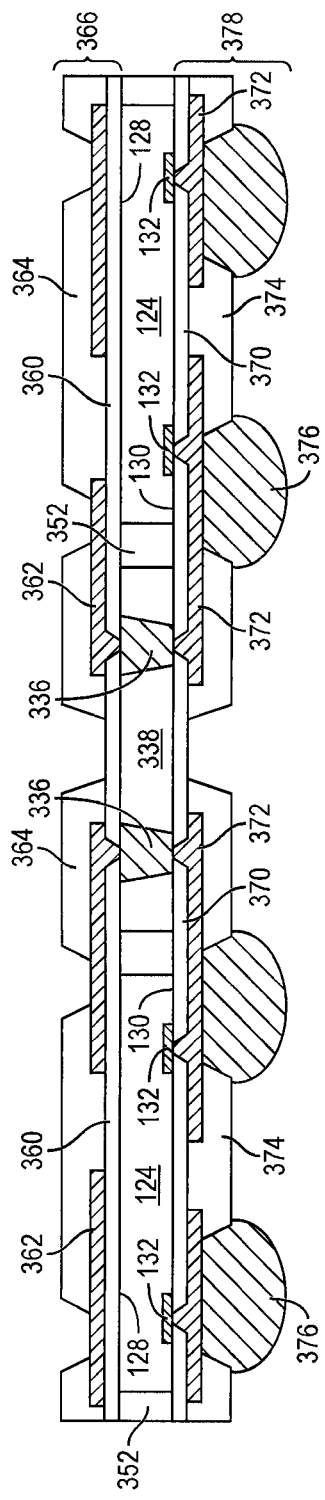
Figure 12P:
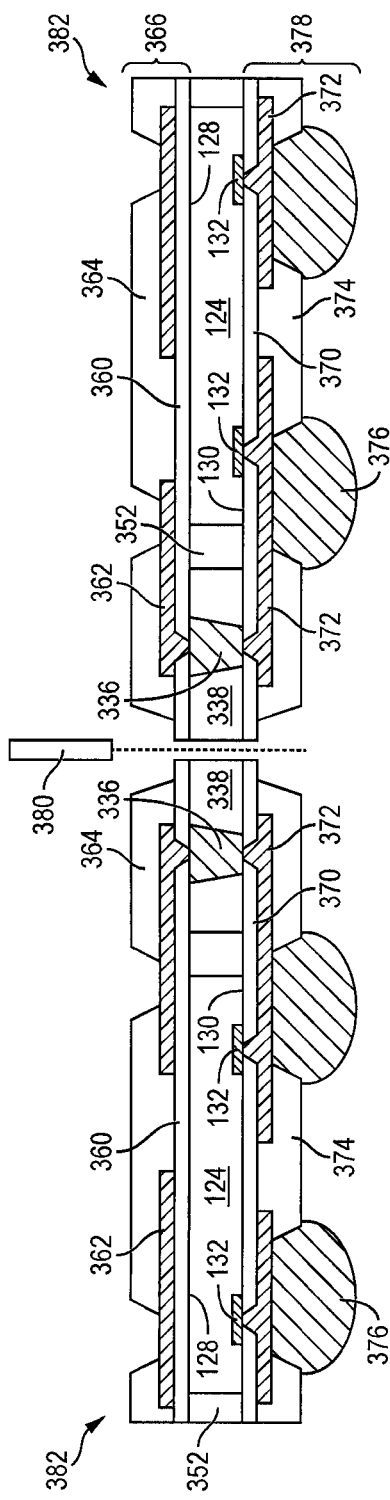

FIGS. 12a-12p illustrate, in relation to FIGS. 1 and 2a-2c, a process of forming an interconnect substrate with trapezoid or polygon shaped bumps for a Fo-WLCSP. FIG. 12a shows conductive film 330 containing one or more layers of Al, Cu, Sn, Ni, Au, Ag, or other suitable electrically conductive material. A stencil 332 with trapezoid or polygon shaped openings 334 is disposed over conductive film 330.

In FIG. 12b, a flux material is deposited within openings 334. An electrically conductive bump material is deposited within trapezoid or polygon shaped openings 334 using an evaporation, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. In one embodiment, the bump material is reflowed by heating the material above its melting point, e.g., 265° C., to form trapezoid or polygon shaped balls or bumps 336. In another embodiment, openings 334 have vertical sidewall to form conductive pillars over conductive film 330.

In FIG. 12c, stencil 332 is removed leaving bumps 336 disposed over conductive film 330.

In FIG. 12d, an encapsulant or molding compound 338 is deposited over conductive film 330 and bumps 336 using a paste printing, compressive molding, transfer molding, liquid encapsulant molding, vacuum lamination, spin coating, or other suitable applicator. Encapsulant 338 can be one or more layers of polymer composite material, such as epoxy resin with filler, epoxy acrylate with filler, polymer with proper filler, or inorganic material with filler. In one embodiment, encapsulant 338 contains greater than 51% silica filler and optional carbon filler. Encapsulant 338 operates as a non-conductive substrate with a thickness of 100-450 μm for structural support.

In FIG. 12e, a portion of encapsulant 338 is removed with grinder 340 to planarize the encapsulant and expose a surface of bumps 336. FIG. 12f shows a surface of bumps 336 exposed from encapsulant 338. A portion of conductive film 330 is removed by an etching process through a patterned photoresist layer to electrically isolate the remaining portions of the conductive film. Alternatively, conductive film 330 is completely removed to expose an opposite surface of bumps 336, as shown in FIG. 12g.

In FIG. 12h, encapsulant 338 is singulated with saw blade or laser cutting tool 342 into individual interconnect substrates 344 with bumps 336 providing z-direction vertical electrical interconnect through the interconnect substrate.

In FIG. 12i, a temporary substrate or carrier 346 contains re-usable or sacrificial base material such as silicon, laminate, polymer composite with high content filler, polymer, beryllium oxide, glass, or other suitable low-cost, lightweight, rigid material for structural support. An interface layer or double-sided tape 348 is formed over carrier 346 as a temporary adhesive bonding film, etch-stop layer, or releasing layer. Semiconductor die 124 from FIGS. 3a-3c is mounted to interface layer 348 using a pick and place operation with active surface 130 oriented toward carrier 346. The interconnect substrate 344 is mounted to interface layer 348 adjacent to semiconductor die 124 using a pick and place operation.

In FIG. 12j, semiconductor die 124 from FIGS. 3a-3c is mounted to interface layer 348 adjacent to a side of interconnect substrate 344 opposite other semiconductor die 124 using a pick and place operation with active surface 130 oriented toward carrier 346. FIG. 12k shows semiconductor die 124 and interconnect substrate 344 mounted to interface layer 348 and carrier 346 with the semiconductor die on opposite sides of the interconnect substrate. The interconnect substrate 344 can have a shape corresponding to the layout of semiconductor die 124. For example, interconnect substrate 344 is cut to fit between semiconductor die 124. Alternatively, interconnect substrate 344 is cut to encircle semiconductor die 124, similar to FIG. 8b. Semiconductor die 124 and interconnect substrate 344 mounted to carrier 346 is shown as reconstituted wafer 350. An interconnect substrate 344 is disposed on both sides of each semiconductor die 124.

In FIG. 12l, an encapsulant or molding compound 352 is deposited over semiconductor die 124, interconnect substrate 344, and carrier 346 using a paste printing, compressive molding, transfer molding, liquid encapsulant molding, vacuum lamination, spin coating, or other suitable applicator. Encapsulant 352 can be polymer composite material, such as epoxy resin with filler, epoxy acrylate with filler, polymer with proper filler, or inorganic material with filler. In one embodiment, encapsulant 352 contains greater than 51% silica filler and optional carbon filler. Encapsulant 352 is non-conductive and environmentally protects the semiconductor device from external elements and contaminants.

In FIG. 12m, a portion of encapsulant 352 is removed with grinder 354 to planarize the encapsulant and expose interconnect substrate 344 and back surface 128 of semiconductor die 124.

In FIG. 12n, an optional insulating or passivation layer 360 is formed over back surface 128 of semiconductor die 124, interconnect substrate 344, and encapsulant 352 using lamination, printing, spin coating, or spray coating. The insulating layer 360 contains one or more layers of polyimide, epoxy, phenolic base polymer dielectric with or without filler, or other material having similar insulating and structural properties. A portion of insulating layer 360 is removed by an etching process through a patterned photoresist layer or LDA to expose bumps 336.

An electrically conductive layer or RDL 362 is formed over insulating layer 360 and bumps 336 using a patterning and metal deposition process such as sputtering, electrolytic plating, and electroless plating. Conductive layer 362 can be one or more layers of Al, Cu, Sn, Ni, Au, Ag, or other suitable electrically conductive material. One portion of conductive layer 362 is electrically connected to bumps 336. Other portions of conductive layer 362 can be electrically common or electrically isolated depending on the design and function of semiconductor die 124.

An insulating or passivation layer 364 is formed over insulating layer 360 and conductive layer 362 using lamination, printing, spin coating, or spray coating. The insulating layer 364 contains one or more layers of polyimide, epoxy, phenolic base polymer dielectric with or without filler, or other material having similar insulating and structural properties. A portion of insulating layer 364 is removed by an etching process through a patterned photoresist layer or LDA to expose conductive layer 362 for additional electrical interconnect. The insulating layers 360 and 364 and conductive layer 362 constitute a build-up interconnect structure 366.

In FIG. 12o, carrier 346 and interface layer 348 are removed by chemical etching, mechanical peeling, CMP, mechanical grinding, thermal bake, UV light, laser scanning, or wet stripping to expose active surface 130 of semiconductor die 124, conductive layer 132, interconnect substrate 344, and encapsulant 352.

An optional insulating or passivation layer 370 is formed over active surface 130 of semiconductor die 124, conductive layer 132, interconnect substrate 344, and encapsulant 352 using lamination, printing, spin coating, or spray coating. The insulating layer 370 contains one or more layers of polyimide, epoxy, phenolic base polymer dielectric with or without filler, or other material having similar insulating and structural properties. A portion of insulating layer 370 is removed by an etching process through a patterned photoresist layer or LDA to expose conductive layer 132 and bumps 336.

An electrically conductive layer or RDL 372 is formed over insulating layer 370, conductive layer 132, and bumps 336 using a patterning and metal deposition process such as sputtering, electrolytic plating, and electroless plating. Conductive layer 372 can be one or more layers of Al, Cu, Sn, Ni, Au, Ag, or other suitable electrically conductive material. One portion of conductive layer 372 is electrically connected to conductive layer 132 and bumps 336. Other portions of conductive layer 372 can be electrically common or electrically isolated depending on the design and function of semiconductor die 124.

An insulating or passivation layer 374 is formed over insulating layer 370 and conductive layer 372 using lamination, printing, spin coating, or spray coating. The insulating layer 374 contains one or more layers of polyimide, epoxy, phenolic base polymer dielectric with or without filler, or other material having similar insulating and structural properties. A portion of insulating layer 374 is removed by an etching process through a patterned photoresist layer or LDA to expose conductive layer 372 for additional electrical interconnect.

An electrically conductive bump material is deposited over the exposed portion of conductive layer 372 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 372 using a suitable attachment or bonding process. In one embodiment, the bump material is reflowed by heating the material above its melting point to form balls or bumps 376. In some applications, bumps 376 are reflowed a second time to improve electrical contact to conductive layer 372. A UBM layer can be formed under bumps 376. Bumps 376 can also be compression bonded to conductive layer 372. Bumps 376 represent one type of interconnect structure that can be formed over conductive layer 372. The interconnect structure can also use stud bump, micro bump, or other electrical interconnect. The insulating layers 370 and 374, conductive layer 372, and bumps 376 constitute a build-up interconnect structure 378.

In another embodiment, the redistribution process can be reversed with build-up interconnect structure 378 formed first after debonding, and then forming build-up interconnect structure 366.

In FIG. 12p, the reconstituted wafer 350 is singulated through interconnect substrate 344 and build-up interconnect structures 366 and 378 with saw blade or laser cutting tool 380 into individual stackable Fo-WLCSP 382.

Figure 13:
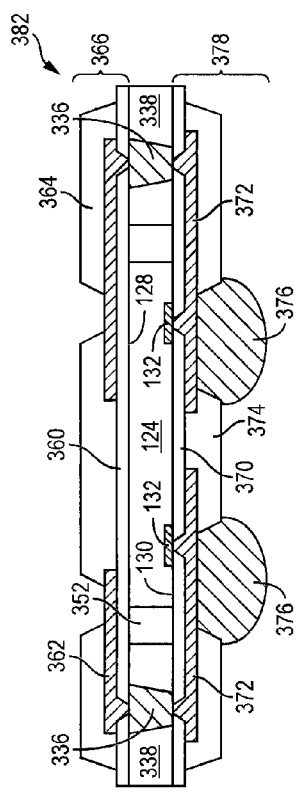
FIG. 13 illustrates the interconnect substrate with trapezoid shaped bumps in a Fo-WLCSP according to FIGS. 12a-12p.

FIG. 13 shows Fo-WLCSP 382 after singulation. Semiconductor die 124 is electrically connected through conductive layers 132 and 372 to bumps 376. Semiconductor die 124 is also electrically connected through conductive layer 372 and bumps 336 to conductive layer 362. The interconnect substrate 344 provides electrical interconnect capability on opposing sides of semiconductor die 124. The interconnect substrate 344 is fabricated with encapsulant or insulating materials having similar properties as encapsulant 352. For example, interconnect substrate 344 and encapsulant 352 each contain an epoxy resin with 50-80% silica filler to make the CTE of the interconnect substrate similar to the CTE of the encapsulant and reduce stress between the structures during thermal cycling. The reduction of stress between interconnect substrate 344 and encapsulant 352 maintains structural integrity with good electrical isolation.

Figure 14:
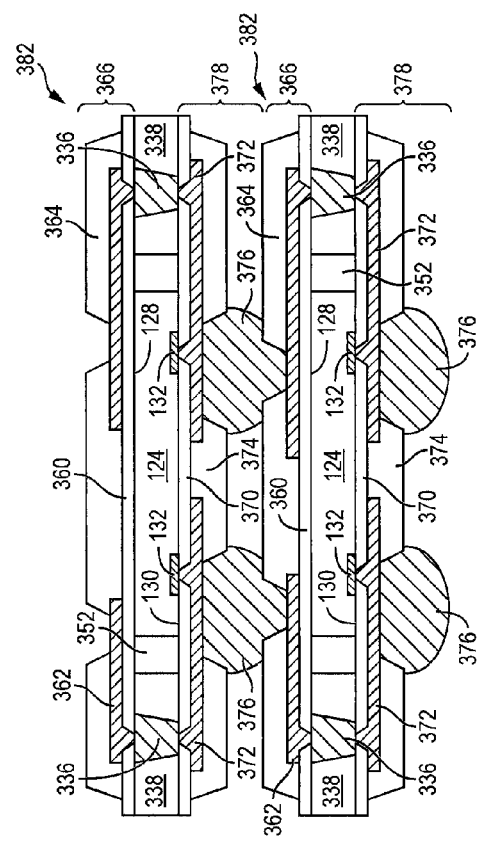
FIG. 14 illustrates two stacked Fo-WLCSP each with an interconnect substrate.

FIG. 14 shows two stacked Fo-WLCSP 382 each with interconnect substrate 344. Semiconductor die 124 in the upper Fo-WLCSP 382 is electrically connected to semiconductor die 124 in the lower Fo-WLCSP 382 through build-up interconnect structures 366 and 378 and interconnect substrates 344. Fo-WLCSP 194 from FIG. 5*a*, Fo-WLCSP 262 from FIG. 9*a*, and Fo-WLCSP 322 from FIG. 11 can be stacked in a similar manner.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
   an interconnect substrate including,
   (a) a first encapsulant base material,
   (b) a conductive layer formed over a major surface of the first encapsulant base material and extending over a side surface of the first encapsulant base material within an opening in the first encapsulant base material, and
   (c) an insulating material disposed in the opening in the first encapsulant base material over the conductive layer;
   a first semiconductor die disposed adjacent to the interconnect substrate including a first surface of the first semiconductor die coplanar with a first surface of the interconnect substrate and a second surface of the first semiconductor die opposite the first surface coplanar with a second surface of the interconnect substrate opposite the first surface of the interconnect substrate;
   a second encapsulant deposited completely around the first semiconductor die and further around an exterior perimeter of the interconnect substrate including a first surface of the second encapsulant coplanar with the first surface of the interconnect substrate and a second surface of the second encapsulant opposite the first surface coplanar with the second surface of the interconnect substrate;
   a first interconnect structure formed over a first surface of the second encapsulant and electrically connected to the conductive layer of the interconnect substrate; and
   a second interconnect structure formed under a second surface of the second encapsulant opposite the first surface of the second encapsulant.

2. The semiconductor device of claim 1, wherein the second interconnect structure is electrically connected to the conductive layer of the interconnect substrate.

3. The semiconductor device of claim 2, further including a plurality of stacked semiconductor devices electrically connected through the first and second interconnect structures and interconnect substrate.

4. The semiconductor device of claim 1, further including a second semiconductor die disposed over the first semiconductor die.

5. The semiconductor device of claim 1, wherein the first encapsulant contains greater than 51% silica filler.

* * * * *